United States Patent
Patel et al.

(10) Patent No.: US 9,010,396 B2
(45) Date of Patent: *Apr. 21, 2015

(54) PROTECTIVE MATERIAL APPLICATOR DEVICE

(75) Inventors: Shraddha Patel, Walnut, CA (US); Charlie LaColla, Woodland Hills, CA (US); Vivian Chou, Diamond Bar, CA (US)

(73) Assignee: Superior Communications, Inc., Irwindale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/361,562

(22) Filed: Jan. 30, 2012

(65) Prior Publication Data

US 2012/0211171 A1    Aug. 23, 2012

Related U.S. Application Data

(63) Continuation-in-part of application No. 13/208,264, filed on Aug. 11, 2011, now Pat. No. 8,393,377, which is a continuation-in-part of application No. 13/053,081, filed on Mar. 21, 2011.

(60) Provisional application No. 61/444,597, filed on Feb. 18, 2011.

(51) Int. Cl.
*B29C 65/00* (2006.01)
*B32B 38/04* (2006.01)
(Continued)

(52) U.S. Cl.
CPC ............... *B29C 63/02* (2013.01); *Y10T 156/17* (2015.01); *Y10T 156/18* (2015.01); *Y10T 156/10* (2015.01);
(Continued)

(58) Field of Classification Search
CPC ...... B65D 1/22; B65D 5/4245; B65D 5/4262; B65D 5/66; B65D 17/16; B65D 33/18; B65D 33/20; B65D 33/24; B65D 43/00; B65D 43/02; B65D 43/06; B65D 43/16; B65D 43/18; B65D 51/04
USPC ............. 156/538, 574, 579, 580, 249; 33/645
See application file for complete search history.

(56) References Cited

U.S. PATENT DOCUMENTS 2,187,585 A * 1/1940 Grigas ........................... 401/14
2,719,663 A   10/1955 Meyer-Jagenberg
(Continued)

FOREIGN PATENT DOCUMENTS

DE    102008024339    11/2009
DE    202014000383    2/2014
(Continued)

OTHER PUBLICATIONS

EcoSwitch Newsletter, 4 pages, Nov. 2007.

*Primary Examiner* — Alex Efta
(74) *Attorney, Agent, or Firm* — Snell & Wilmer LLP

(57) ABSTRACT

Devices, methods and systems disclosed herein relate to the application of a protective film on a surface of an electronic device that instantly reduces air bubbles and eliminates the waiting time usually required when using a wet fluid solution. In one embodiment, a well apparatus graspable by a user's hand for receiving any of a plurality of mobile communication device inserts is provided. Each of the plurality of mobile communication device inserts may have a mobile communication device receiving cavity of a different shape or size configured to receive a mobile communication device of a particular shape and size. After inserting a mobile communication device insert into the well apparatus, a user may insert a mobile communication device into the receiving cavity and apply a protective layer with a roller.

10 Claims, 53 Drawing Sheets

(51) Int. Cl.
*B29C 63/02* (2006.01)
*B29C 63/00* (2006.01)
*B32B 37/00* (2006.01)
*B32B 38/10* (2006.01)
*H05K 5/03* (2006.01)
*H05K 13/00* (2006.01)
*H05K 13/04* (2006.01)
*B29L 31/34* (2006.01)
*H04M 1/02* (2006.01)

(52) U.S. Cl.
CPC ..... *B29C 2063/0008* (2013.01); *B32B 37/0007* (2013.01); *B32B 37/0023* (2013.01); *B32B 38/10* (2013.01); *H05K 5/03* (2013.01); *H05K 13/0053* (2013.01); *H05K 13/0447* (2013.01); *B29L 2031/3437* (2013.01); *H04M 1/0283* (2013.01); *H04M 1/0266* (2013.01); *B29C 63/0004* (2013.01); *B29C 63/0047* (2013.01); *B29C 63/0056* (2013.01)

(56) References Cited

U.S. PATENT DOCUMENTS

| | | | |
|---|---|---|---|
| 2,828,501 A * | 4/1958 | Brown, Sr. | 15/114 |
| 2,847,151 A | 8/1958 | Meyer-Jagenberg | |
| 3,127,299 A * | 3/1964 | Hect | 156/579 |
| 3,156,603 A * | 11/1964 | Robinson | 156/577 |
| 3,208,899 A | 9/1965 | Bicher, Jr. | |
| 3,650,209 A * | 3/1972 | Allport | 101/269 |
| 3,709,760 A | 1/1973 | Knoner | |
| 3,881,979 A | 5/1975 | Kelly | |
| 3,907,628 A * | 9/1975 | Buske | 156/574 |
| 4,648,935 A | 3/1987 | Brown et al. | |
| 5,068,951 A * | 12/1991 | Abrams | 492/13 |
| 5,069,732 A * | 12/1991 | Levine | 156/71 |
| 5,437,593 A * | 8/1995 | Gustavsen | 492/13 |
| 5,545,287 A * | 8/1996 | Carlson | 156/575 |
| 5,562,262 A | 10/1996 | Pennell | |
| 5,637,177 A * | 6/1997 | Os | 156/286 |
| 6,054,009 A * | 4/2000 | Cote et al. | 156/249 |
| 6,478,068 B1 | 11/2002 | Brown | |
| 6,481,572 B2 * | 11/2002 | Wien et al. | 206/232 |
| 6,491,775 B1 | 12/2002 | Janssen et al. | |
| 6,514,588 B2 * | 2/2003 | Rosenbaum et al. | 428/40.1 |
| 6,536,589 B2 | 3/2003 | Chang | |
| 6,754,092 B2 | 6/2004 | McDowell | |
| 6,802,741 B1 | 10/2004 | Shatkin | |
| 6,925,684 B2 | 8/2005 | Kang et al. | |
| 6,941,632 B1 * | 9/2005 | Mead et al. | 29/424 |
| 7,077,185 B2 | 7/2006 | Steinberger | |
| 7,226,521 B2 | 6/2007 | Steinhardt et al. | |
| 7,249,976 B1 | 7/2007 | Watson | |
| D556,448 S | 12/2007 | Brandenburg | |
| D559,230 S | 1/2008 | Griffin et al. | |
| D559,529 S | 1/2008 | Griffin et al. | |
| 7,315,097 B2 | 1/2008 | Tajika | |
| 7,349,004 B2 | 3/2008 | Priestman et al. | |
| D575,056 S | 8/2008 | Tan | |
| 7,441,581 B2 * | 10/2008 | Pitzen | 156/577 |
| D582,875 S | 12/2008 | Haspil et al. | |
| 7,505,072 B2 | 3/2009 | Saitoh | |
| 7,540,933 B2 | 6/2009 | Dugas et al. | |
| 7,617,079 B2 | 11/2009 | Stewart et al. | |
| 7,663,878 B2 | 2/2010 | Swan et al. | |
| 7,778,023 B1 | 8/2010 | Mohoney | |
| 7,784,610 B2 | 8/2010 | Mason | |
| 7,910,833 B2 | 3/2011 | McGinley et al. | |
| 7,923,869 B2 | 4/2011 | Bagenholm et al. | |
| 7,957,524 B2 | 6/2011 | Chipping | |
| 7,960,648 B2 | 6/2011 | McGinley et al. | |
| 8,015,651 B2 * | 9/2011 | Knopow et al. | 15/104.002 |
| 8,393,377 B2 * | 3/2013 | Patel et al. | 156/538 |
| 8,905,107 B2 * | 12/2014 | Patel et al. | 156/538 |
| 2003/0232167 A1 * | 12/2003 | Wimmershoff et al. | 428/42.1 |
| 2004/0174665 A1 | 9/2004 | Mockridge et al. | |
| 2004/0194896 A1 | 10/2004 | Steinberger | |
| 2005/0070328 A1 | 3/2005 | Wang et al. | |
| 2005/0287953 A1 | 12/2005 | Ikeda et al. | |
| 2006/0096713 A1 | 5/2006 | Chen | |
| 2006/0096714 A1 | 5/2006 | Chen | |
| 2006/0128417 A1 | 6/2006 | Wilson | |
| 2006/0258325 A1 | 11/2006 | Tsutaichi et al. | |
| 2007/0029458 A1 | 2/2007 | Wang et al. | |
| 2007/0107828 A1 * | 5/2007 | Barker et al. | 156/71 |
| 2007/0143946 A1 * | 6/2007 | Kim | 15/230.11 |
| 2008/0041529 A1 * | 2/2008 | King | 156/538 |
| 2008/0290731 A1 | 11/2008 | Cassidy | |
| 2009/0001232 A1 | 1/2009 | Seo et al. | |
| 2009/0017883 A1 | 1/2009 | Lin | |
| 2009/0027922 A1 | 1/2009 | Tracy et al. | |
| 2009/0038927 A1 | 2/2009 | Guo et al. | |
| 2009/0047415 A1 | 2/2009 | Jiang et al. | |
| 2009/0186181 A1 | 7/2009 | Mase | |
| 2009/0213630 A1 | 8/2009 | Wu | |
| 2009/0247237 A1 | 10/2009 | Mittleman et al. | |
| 2011/0117977 A1 | 5/2011 | Yamashita et al. | |
| 2012/0046002 A1 | 2/2012 | Hill et al. | |
| 2012/0110868 A1 * | 5/2012 | Abbondanzio | 33/645 |
| 2012/0211170 A1 * | 8/2012 | Patel et al. | 156/538 |
| 2012/0211171 A1 | 8/2012 | Patel | |
| 2013/0020020 A1 | 1/2013 | Liu | |
| 2013/0048203 A1 * | 2/2013 | Yau et al. | 156/230 |
| 2013/0133807 A1 | 5/2013 | Wang et al. | |
| 2013/0199714 A1 * | 8/2013 | Patel et al. | 156/249 |
| 2013/0237296 A1 | 9/2013 | Chen | |
| 2013/0255874 A1 | 10/2013 | Tapio et al. | |
| 2013/0299075 A1 * | 11/2013 | Colby et al. | 156/249 |
| 2014/0027050 A1 * | 1/2014 | Napier | 156/249 |
| 2014/0124146 A1 * | 5/2014 | Patel et al. | 156/574 |
| 2014/0130971 A1 * | 5/2014 | Wu et al. | 156/249 |
| 2014/0338829 A1 * | 11/2014 | Peng et al. | 156/249 |

FOREIGN PATENT DOCUMENTS

| | | |
|---|---|---|
| EP | 2279864 | 2/2011 |
| GB | 2438655 | 12/2007 |
| GB | 2443454 | 5/2008 |
| JP | 10199422 | 7/1998 |
| KR | 20030032392 | 4/2003 |
| WO | WO 2008/062174 | 5/2008 |

\* cited by examiner

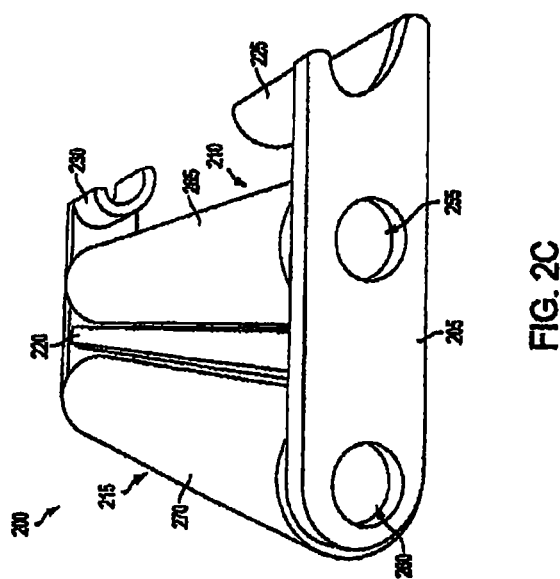

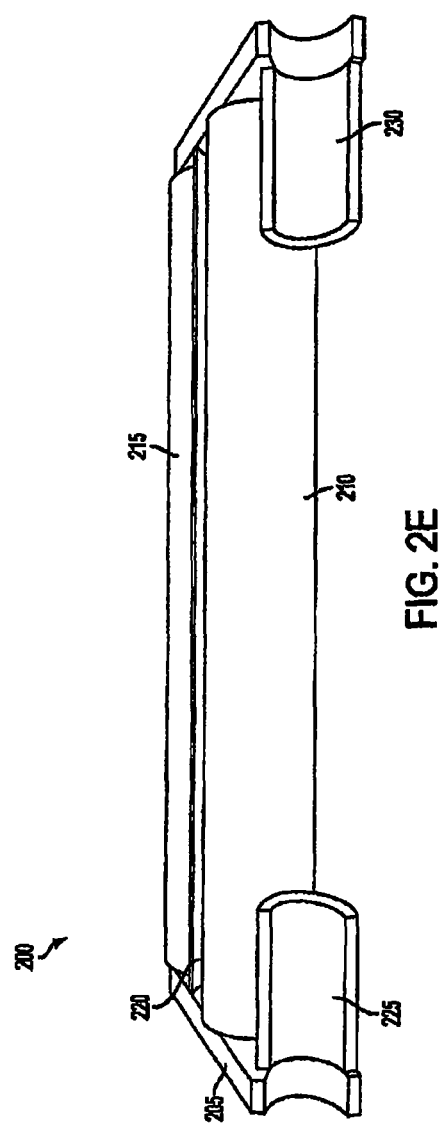

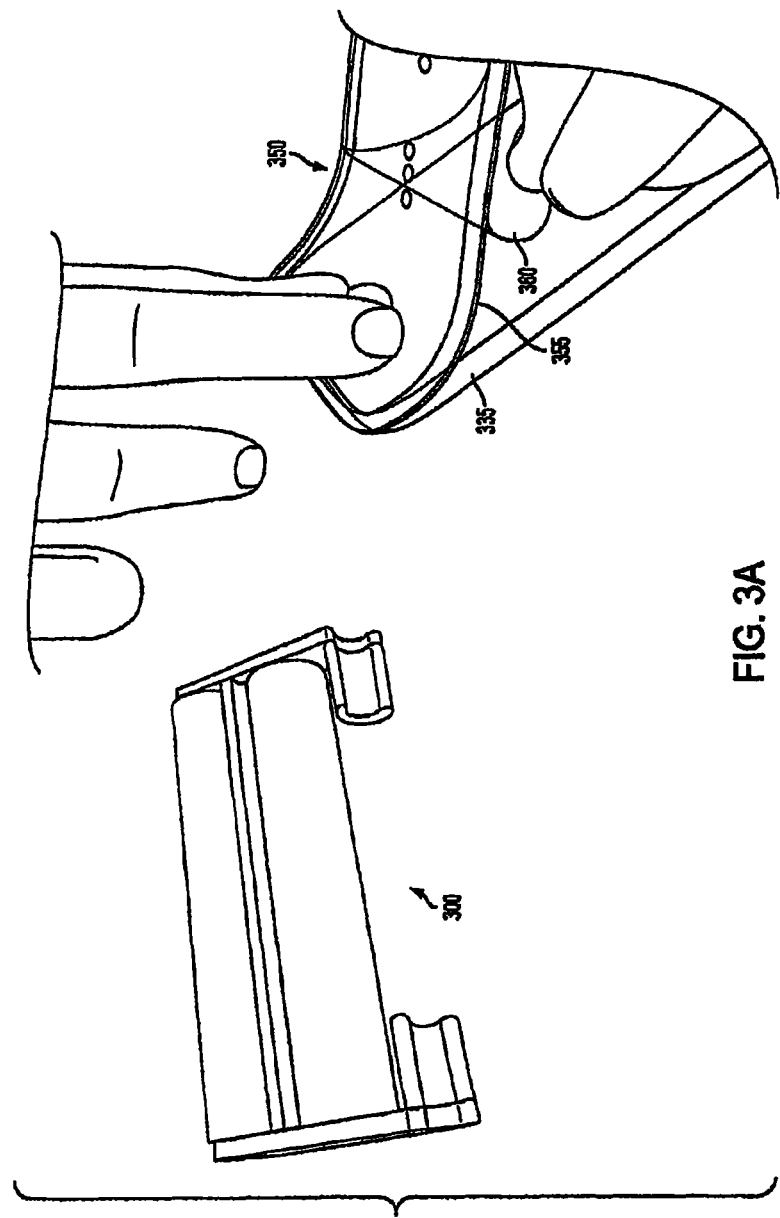

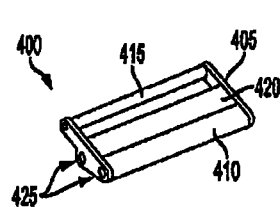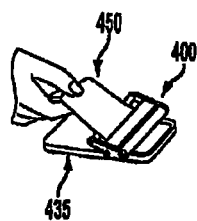
FIG. 4A  FIG. 4B
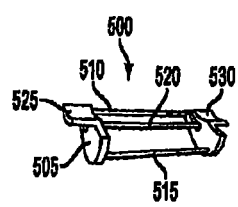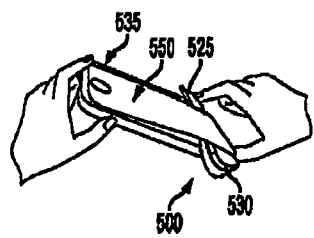
FIG. 5A  FIG. 5B

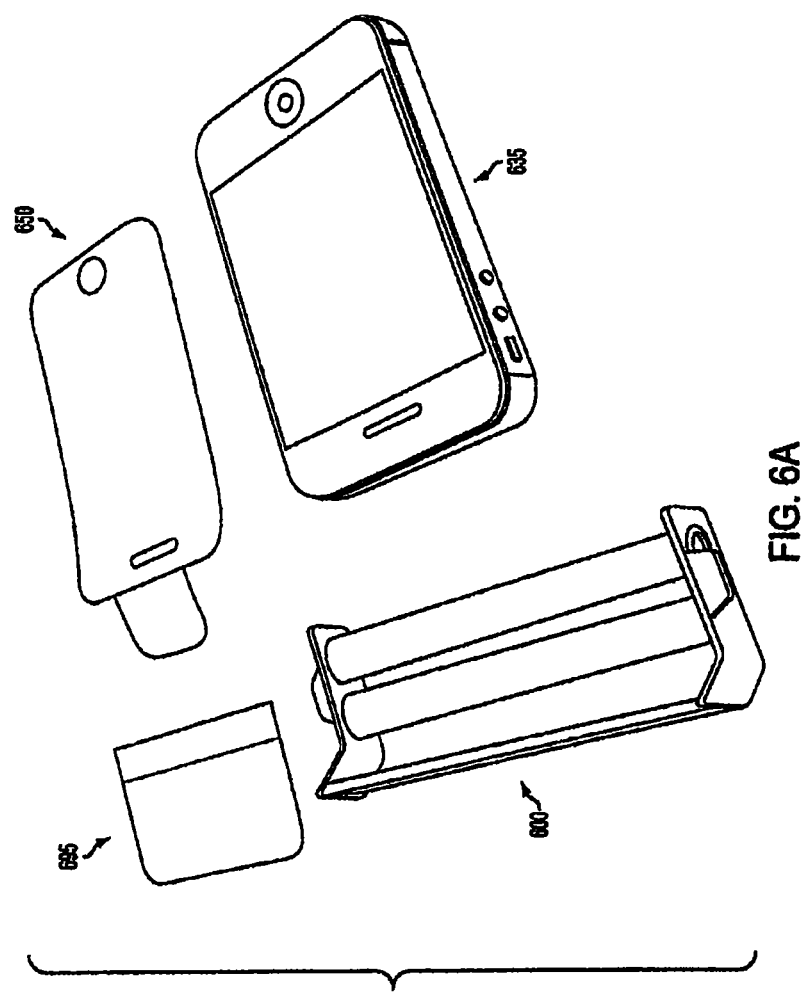

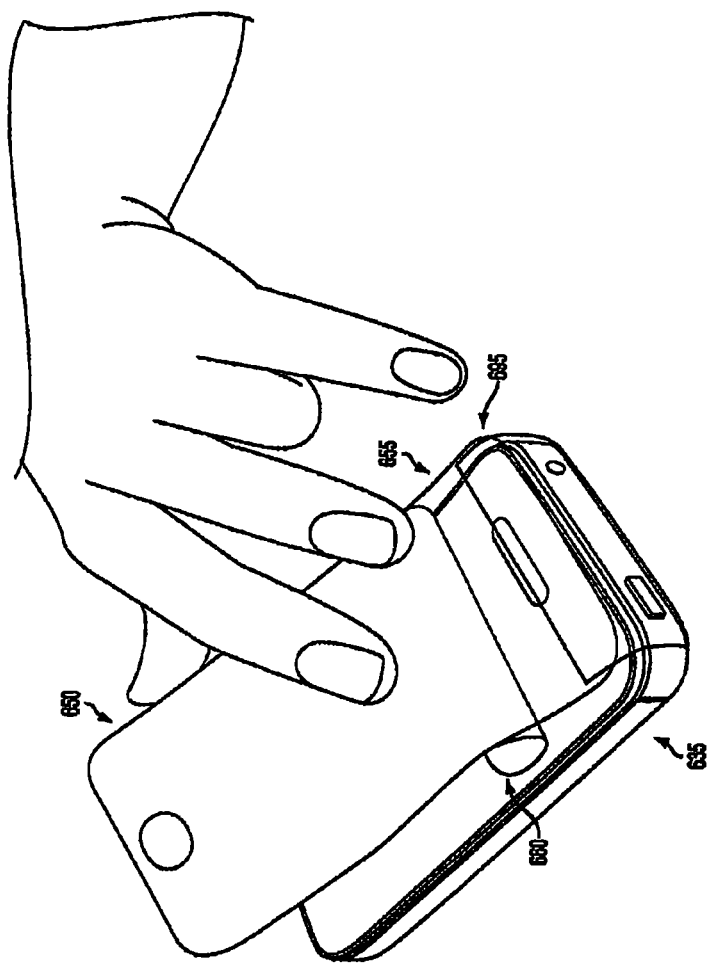

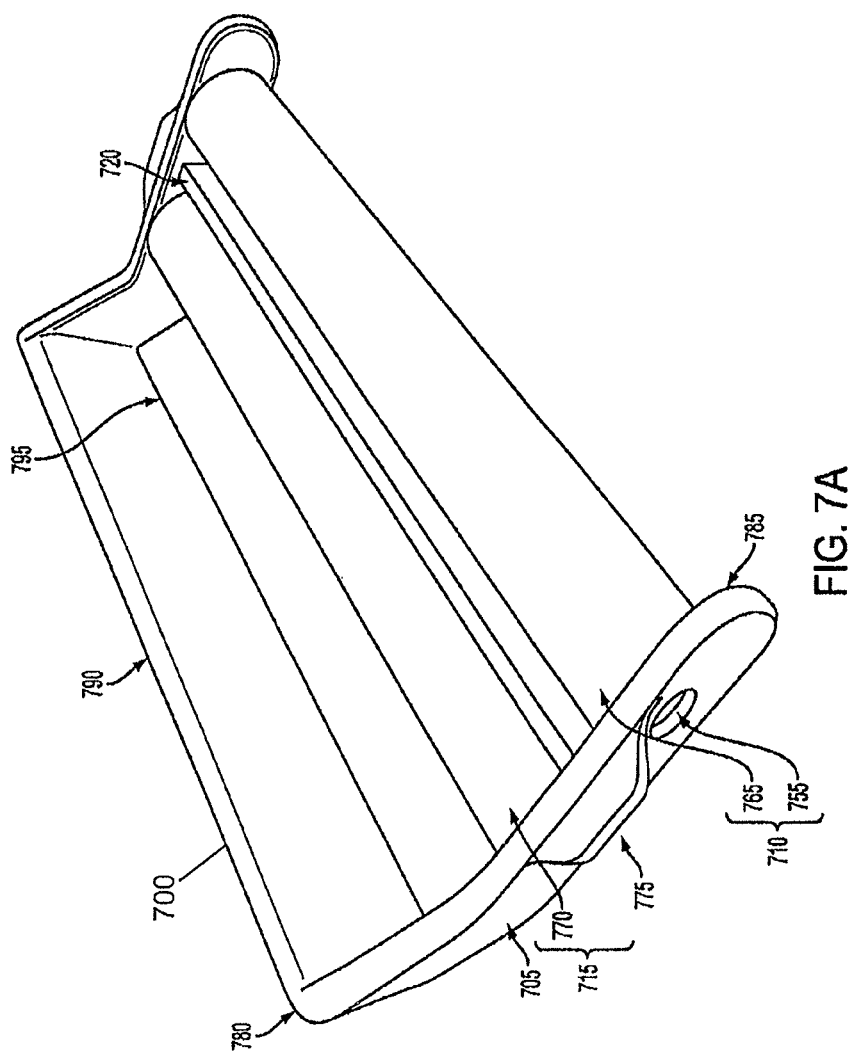

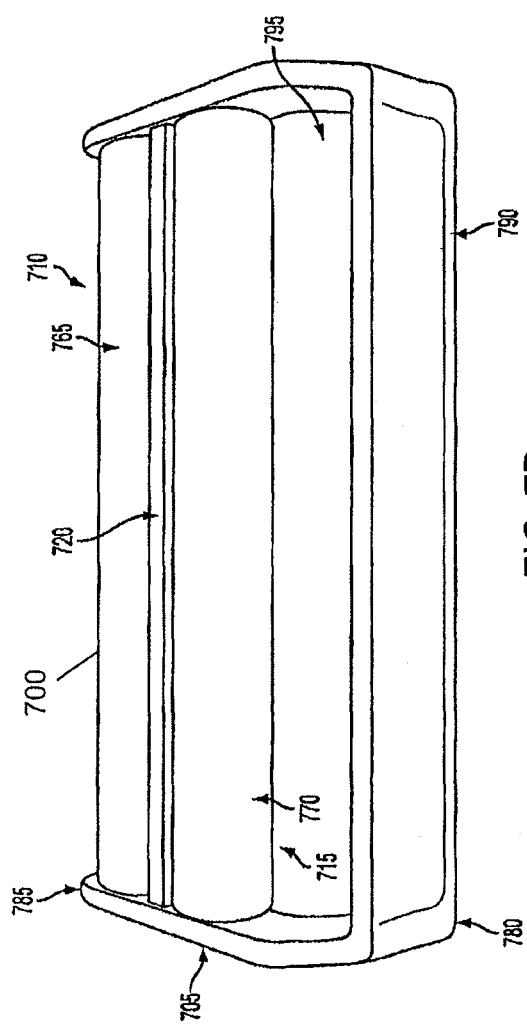

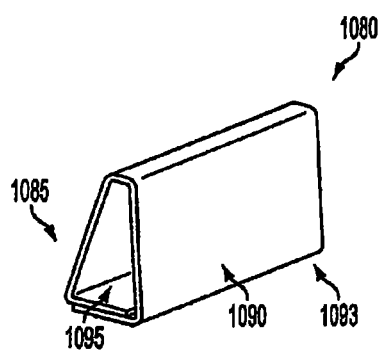
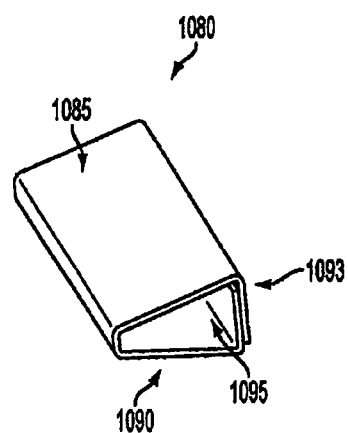
FIG. 10B
FIG. 10C
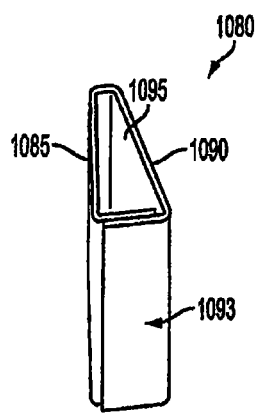
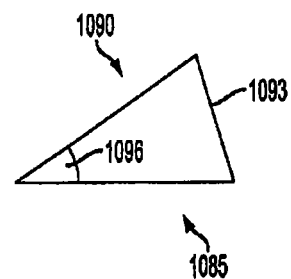
FIG. 10D
FIG. 10E

PROTECTIVE MATERIAL APPLICATOR DEVICE

CROSS REFERENCE TO RELATED APPLICATIONS

This application is a continuation-in-part of U.S. patent application Ser. No. 13/208,264 entitled "PROTECTIVE MATERIAL APPLICATOR DEVICE" filed on Aug. 11, 2011 now U.S. Pat. No. 8,393,77, which in turn is a continuation-in-part of U.S. patent application Ser. No. 13/053,081 entitled "PROTECTIVE MATERIAL APPLICATOR DEVICE" filed on Mar. 21, 2011, which in turn claims the benefit of and the priority of U.S. Provisional Application No. 61/444,597 filed on Feb. 18, 2011. The entire contents of all of these applications are hereby incorporated by reference herein.

BACKGROUND

1. Field

The present invention relates to an apparatus, method and/or system for applying a protective material or layer to a surface of a device. For example, the present invention may allow a user to apply a protective material or layer to the surface or screen of an electronic device.

2. Description of Related Art

Electronic devices such as cellular phones, portable tablet computers and the like are gaining widespread popularity. For example, the Apple® iPhone® is estimated to reach 100 million users by the end of 2011. In addition, almost 15 million Apple® iPads® have been sold to date. The sheer volume of electronic devices sold by other major competitors such as Motorola®, Samsung®, HTC®, etc. only further confirms that consumers find these products very desirable. It should not come as a surprise that these same consumers want to protect their products from accidental denting, scratching or otherwise damaging these electronic devices. Accordingly, manufacturers have produced different cases, protective films and the like to help the consumer keep their electronic devices safe.

However, with the progress of touch-based screens for operating these electronic devices, thick cases might not be suitable, as these cases may prevent the user from operating the device. Accordingly, many manufacturers are now producing clear films that keep, for example, the display of the electronic device clean while at the same time protecting the screen from accidental damage such as scratching.

Despite the benefits that these films or screen protectors provide, many drawbacks remain in this relatively new technology. For example, many of these protectors require the use of a wet fluid solution to enable the film to adhere to the electronic device. Using a wet fluid solution is messy, requires a lot of work by the user to "squeegee" the excess out, and might not eliminate all annoying air bubbles immediately. Indeed, many of these products warn that 24-48 hours may be needed before the user can effectively determine if the trapped air bubbles are going to disappear. In other words, some consumers may have to wait for days before determining if the film was applied correctly. To some consumers, this long wait is annoying and may reduce the enthusiasm of an otherwise exciting moment of obtaining a cutting-edge electronic device. Moreover, the electronic device might not be functional until the solution dries out in 24-48 hours. Alternatively, the consumer might not want to risk using the device in fear during this time period as he or she may believe that usage may impact the film prior to drying of the wet fluid solution.

What is needed is an applicator that eliminates the drawbacks above and allows a user to apply the protective film effectively for use without waiting for the protective film to dry and/or waiting for the air bubbles to disappear.

SUMMARY

Devices, methods and systems are provided to apply a protective film on a surface of an electronic device which reduces or eliminates air bubbles and eliminates the waiting time usually required when using a wet fluid solution.

In one embodiment, a roller apparatus may be used in a protective film application process to eliminate air bubbles and assist the user in applying the film to the electronic device correctly. The roller apparatus may include a carriage or housing, one or more rollers coupled to or integrated with the housing and a splitter configured to separate the protective film from a backing material during the application process.

In one embodiment, the roller apparatus may be configured to be maneuvered into position with the splitter between the exposed portion of the protective film and the backing with the roller portion of the roller apparatus trailing behind. As the user pulls the roller apparatus from a first edge of the electronic device to a second edge of the electronic device, the protective film may be removed from the backing, applied to the device, and any air bubbles may be immediately squeezed out such that in one motion the protective film may be applied to the electronic device without the use of a wet fluid solution.

In one embodiment, a method of applying the protective film to an electronic device is provided. For example, first, a user may remove one edge of the protective film from a backing and line up the removed edge of the protective film with the corresponding edge of the electronic device. No wet fluid solution is sprayed on or applied to the surface or screen of the electronic device. Next, the roller apparatus may be maneuvered into position with the splitter between the exposed portion of the protective film and the backing with the roller portion of the roller apparatus trailing behind. As the user pulls the roller apparatus from a first edge of the electronic device to a second edge of the electronic device, the protective film may be removed from the backing, applied to the device, and any air bubbles may be immediately eliminated such that in one motion the protective film may be applied to the electronic device without the use of a wet fluid solution.

In one embodiment, for example, where the protective film includes an overlay portion intended to be pressed down on the sides perpendicular or orthogonal to the main surface, the user may press the protective film down on the intended, corresponding areas and use the roller portion of the roller apparatus to further press down on the protective film.

In one embodiment, a roller apparatus may include an integrated stand for propping up or holding the electronic device. In a first operational configuration, the roller apparatus may be used in a protective film application process to eliminate air bubbles and assist the user in applying the film to the electronic device correctly. In a second operational configuration, the roller apparatus may be used as a stand for propping up the electronic device. The roller apparatus may include a carriage or housing, one or more rollers coupled or integrated with the housing and a stand portion for propping up the electronic device.

In one embodiment, to further assist the user in applying the protective film, a roller apparatus guide may be used in conjunction with a roller apparatus. The roller apparatus guide may be a substantially rectangular block having three or more portions including an inner wall defining a cavity used to receive or mount a mobile communication device, a roller supporting surface configured to be flush with a mounted mobile communication device and a set of roller guiding rails which may be parallel to one another and raised above the roller supporting surface. In addition, the roller apparatus guide may include pressing portions to assist the user when applying the protective film, a film application system may include a roller apparatus, a roller apparatus guide, a mobile communication device, a protective film to be applied to a mobile communication device, and a wedge. Here, a wedge is incorporated to help the user apply the film to the mobile communication device. The wedge may be substantially triangular in shape, although minor variations are allowed provided that the functionality of the wedge remains. The wedge may comprise three adjacent, connected surfaces forming the structure of the wedge. The spacing created by the connecting of surfaces may be hollow or, in one embodiment, may be filled. The wedge may function to assist in removing the backing of the film during the film application process.

In one embodiment, provided is an apparatus graspable by a user's hand for receiving any of a plurality of mobile communication device inserts, each of the plurality of mobile communication device inserts having a mobile communication device receiving cavity of a different shape or size configured to receive a mobile communication device of a particular shape and size, the apparatus for applying a protective layer to surfaces of different mobile communication devices, the apparatus comprising: a body defining a well for receiving any of the plurality of mobile communication device inserts; and a pair of rails attached to the body portion for guiding a roller used to apply the protective layer.

In one embodiment provided is an insert apparatus serving as a physical interface for a mobile communication device and a well apparatus to facilitate applying a protective layer to a surface of a mobile communication device, the insert apparatus comprising: a ring for receiving the mobile communication device, the ring including an outer wall having a perimeter sized to removably fit into a cavity of the well apparatus, and an inner wall defining a cavity sized to fit the mobile communication device.

In one embodiment, provide is a system for applying a protective layer to a surface of a mobile communication device, the system comprising: a roller for applying the protective layer to the surface of the mobile communication device; an insert for receiving and securing the mobile communication device; and a base apparatus configured to receive the insert and the mobile communication device, the base apparatus including: a body defining a well for receiving the insert, and a pair of rails attached to the body for guiding the roller for applying the protective layer to the surface of the mobile communication device.

In one embodiment, provided is a system for applying a first protective layer to a first surface of a first mobile communication device and a second protective layer to a second surface of a second mobile communication device, the system comprising: a first insert having a cavity sized to receive and secure the first mobile communication device; a second insert having a cavity sized to receive and secure the second mobile communication device; a base apparatus configured to receive the first insert and the first mobile communication device when the second insert and the second mobile communication device is not received by the base apparatus, and further configured to receive the second insert an the second communication device when the first insert and the first mobile communication device is not received by the base apparatus, the base apparatus including: a body defining a well for receiving the first insert and the first mobile communication device when the second insert and the second mobile communication device is not received by the base apparatus, and further configured to receive the second insert an the second communication device when the first insert and the first mobile communication device is not received by the base apparatus, and a pair of rails attached to the body for guiding a roller for applying the first protective layer to the first surface of the first mobile communication device when the first insert and the first mobile communication device are received by the base apparatus, the pair of rails further for guiding the roller for applying the second protective layer to the second surface of the second mobile communication device when the second insert and the second mobile communication device are received by the base apparatus.

In one embodiment, provided is a screen protector application system for applying a protective material to a surface of an electronic device, the system comprising: a roller apparatus configured to press the protective material against the surface of the electronic device; a base apparatus graspable by a user's hand for receiving the electronic device and for supporting the roller apparatus, the base apparatus including: a body having a roller-supporting surface for supporting the roller apparatus, the roller-supporting surface further defining a cavity configured such that when the electronic device is positioned within the cavity, a top surface of the electronic device is substantially planar with the roller-supporting surface, and a pair of parallel rails raised above the roller-supporting surface and separated from one another by at least the cavity, the pair of rails for aligning the roller apparatus.

BRIEF DESCRIPTION OF THE DRAWINGS

The features, obstacles, and advantages of the present invention will become more apparent from the detailed description set forth below when taken in conjunction with the drawings, wherein:

FIG. 2C illustrates a side perspective view of a roller apparatus according to one or more embodiments described herein.

FIG. 2E illustrates a rear perspective view of a roller apparatus according to one or more embodiments described herein.

FIG. 3A illustrates a protective material set-up configuration according to one or more embodiments described herein.

FIG. 4A illustrates a perspective view of a roller apparatus according to one or more embodiments described herein.

FIG. 4B illustrates a roller apparatus operation configuration according to one or more embodiments described herein.

FIG. 5A illustrates a perspective view of a roller apparatus according to one or more embodiments described herein.

FIG. 5B illustrates a roller apparatus operation configuration according to one or more embodiments described herein.

FIG. 6A illustrates a roller apparatus with an integrated stand, a protective film, a film tab and an electronic device according to one or more embodiments described herein.

FIG. 6F illustrates a protective material set-up configuration according to one or more embodiments described herein.

FIG. 7A illustrates a perspective top view of a roller apparatus with an integrated stand according to one or more embodiments described herein.

FIG. 7D illustrates a perspective rear view of a roller apparatus with an integrated stand according to one or more embodiments described herein.

FIG. 10B illustrates the wedge of FIG. 10A according to one or more embodiments described herein.

FIG. 10C illustrates the wedge of FIG. 10A according to one or more embodiments described herein.

FIG. 10D illustrates the wedge of FIG. 10A according to one or more embodiments described herein.

FIG. 10E illustrates the wedge of FIG. 10A according to one or more embodiments described herein.

DETAILED DESCRIPTION

Apparatus, systems and/or methods that implement the embodiments of the various features of the present invention will now be described with reference to the drawings. The drawings and the associated descriptions are provided to illustrate some embodiments of the present invention and not to limit the scope of the present invention. Throughout the drawings, reference numbers are re-used to indicate correspondence between referenced elements.

Figure 1:
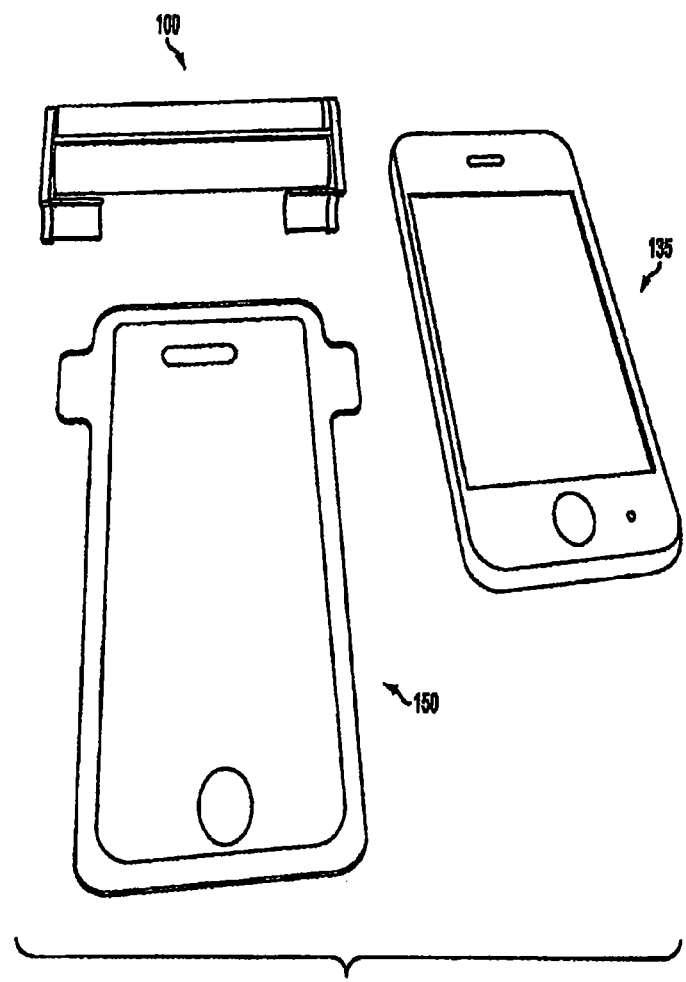
FIG. 1 illustrates a roller apparatus, a protective film and an electronic device according to one or more embodiments described herein.

FIG. 1 illustrates a roller apparatus 100, an electronic device 135 and a film 150. The roller apparatus 100 may be used to apply the film 150 to a surface of the electronic device 135. The film 150 may protect the electronic device 135 from damage (e.g., scratches) and/or smudges. As shown, the roller apparatus 100 may have a width wider than the width of the electronic device 135 and the film 150. In this manner, the roller apparatus 100 may be configured to apply films of varying sizes onto devices of varying sizes. In addition, the roller apparatus 100 may be configured to apply the film 150 to a device with a curved surface (not shown). In one embodiment, the roller apparatus 100 may be increased in size or decreased in size (along with the appropriate proportions) for usage with significantly larger films and devices (e.g., a tablet PC).

Figure 2A:
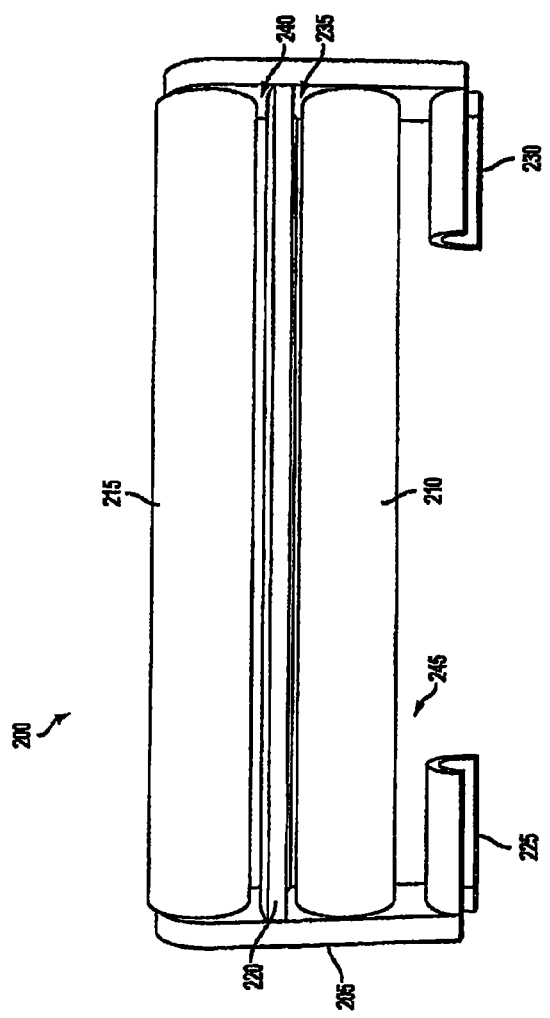
FIG. 2A illustrates a top view of a roller apparatus according to one or more embodiments described herein.

FIG. 2A illustrates one embodiment of a roller apparatus 200. As shown, the roller apparatus 200 may include a roller base or carriage 205, a first or front roller 210, a second or back roller 215, a mid-bar 220, a first or left splitter 225 and a second or right splitter 230. The roller base 205 may be constructed out of a rigid material such as a plastic, a metal, a wood and the like. The roller base 205 is configured to provide structural support for the roller apparatus 200. In addition, the roller base 205 may be sized to be easily manipulated and graspable by a user's hand. The roller base 205 may be configured to hold the first roller 210 in place and allow the first roller 210 to "roll" or rotate about a longitudinal axis created by the roller base 205. In one example, the roller base 205 may be structured to include a first rod member (not shown) spanning the entire length of the first roller 210, thereby forming an axis for the first roller 210 to rotate about. The first roller 210 is configured to rotate and apply physical pressure on a film (e.g., film 150 of FIG. 1) in operation. The first roller 210 may be separated from the mid bar 220 by a first roller gap 235 and may be further separated from the first splitter 225 and the second splitter 230 by a splitter gap 245. These gaps (e.g., the first roller gap 235 and the splitter gap 245) may serve as structural openings to allow the first roller 210 to rotate freely. The second roller 215 may be a redundant pressure applicator and may be substantially the same size as, and substantially parallel to the first roller 210. The first roller 210 and the second roller 215 may be separated by a mid bar 220. The mid bar 220 may connect the two ends of the roller base 205 and provide the entire roller apparatus with stability. In addition, a gap 240 may exist between the mid bar 220 the second roller 215 to allow the second roller 215 to rotate freely. The first splitter 225 and the second splitter 230 may lie along the same plane and may be slightly curved. The splitters 225 and 230 may be configured to be rigid and may function to separate an adhesive portion of a film (e.g., film 150) from its non-adhesive backing during the application process.

Figure 2B:
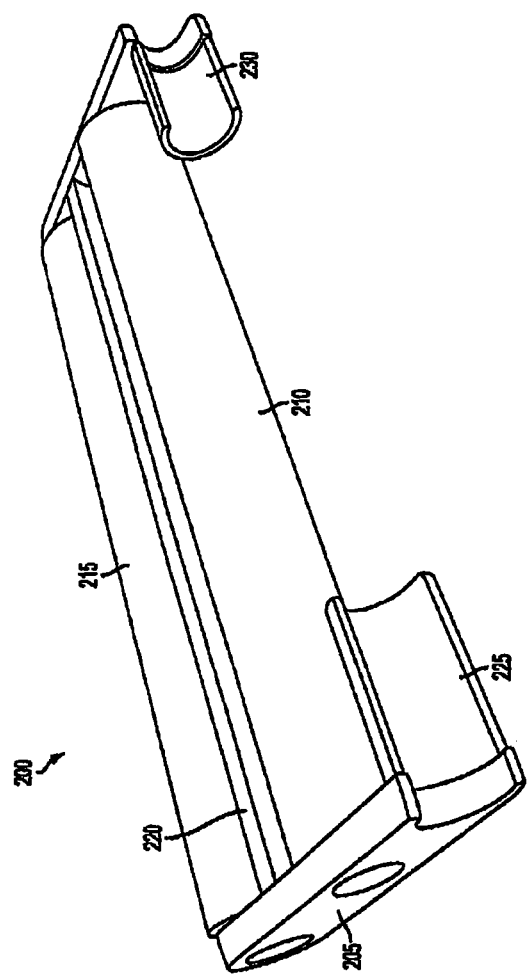
FIG. 2B illustrates a perspective view of a roller apparatus according to one or more embodiments described herein.

FIG. 2B is a perspective view of the roller apparatus 200. In one embodiment, the roller apparatus 200 may be configured to function as a film applicator for phone-sized devices and may have a length of 1-2 inches, a width of 2-4 inches, and a height of 0.5-1 inch. In one embodiment, the roller apparatus 200 may be configured to function as a film applicator for tablet-sized devices and may have a length of 1-5 inches, a width of 8-12 inches, and a height of 0.5-2 inches. Other dimensions are also possible depending on the size of the device to be protected and/or depending on the size of the film to be applied.

FIG. 2C is a side perspective view of the roller apparatus 200. As shown, the rollers 210 and 215 may include inner cores 255 and 260, respectively. In addition, the rollers 210 and 215 may include outer cores 265 and 270, respectively. In one embodiment, the outer cores 265 and 270 may be configured to "flatten" at the point of contact and thereby providing pressure in a more uniform and distributed manner, efficiently eliminating air bubbles. The outer cores 265 and 270 may be configured to return to its original configuration when not pressed to the surface of the device (e.g., electronic device 135).

In one embodiment, the mid bar 220 may be curved or straight, and may have a length substantially equivalent to the length of the rollers 210 and 215, thereby joining the two ends of the roller base 205. Additionally, the mid bar 220 may be configured to have a width shorter than a diameter of the outer cores 265 and 270. In this manner, the mid bar 220 provides structural support to the roller apparatus 200 without contacting the film (e.g., film 150) or the device (e.g., electronic device 135) during the application process.

In one embodiment, the splitters 225 and 230 may be located adjacent to the first roller 210. The splitters 225 and 230 may jut inward from the roller base 205 so as not to extend the footprint of the roller apparatus 200. In addition, the splitters 225 and 230 may function to remove the non-adhesive backing from the adhesive portion of the film (e.g., film 150) during an application process. While shown to be two, distinct parallel elements, the splitters 225 and 230 may be joined together (e.g., by extending the splitters 225 and 230 towards one another) and/or may be constructed as one piece. The splitters 225 and 230 may be constructed out of any material with sturdiness sufficient enough to separate and remove the adhesive portion of the film (e.g., film 150) from a non-adhesive backing. In one embodiment, the splitters 225 and 230 may be curved and formed in the shape of a "C" as shown in FIG. 2C. The curvature ("C" shape) of the splitters 225 and 230 may advantageously increase the ease of by which the non-adhesive backing from the adhesive portion of the film (e.g., film 150) is removed. However, other configurations are possible. For example, a "letter opener" configuration where the splitters 225 and 230 include tapered edges may be utilized.

While described in FIG. 2C to have inner cores 255 and 260, certain embodiments of the roller apparatus 200 might not include inner cores 255 and 260. In one embodiment, the roller apparatus 200 may comprise any number of rollers (e.g., one roller—by removing the second roller 215, three rollers—by extending the width of roller base 205 and adding a third roller, etc.) In one embodiment, the roller apparatus 200 may comprises two parts, a roller (e.g., the first roller 210) and a base (e.g., the roller base 205), wherein the base may include an integrated mid bar (e.g., mid bar 220) and a splitter (e.g., splitters 225 and 230).

Figure 2D:
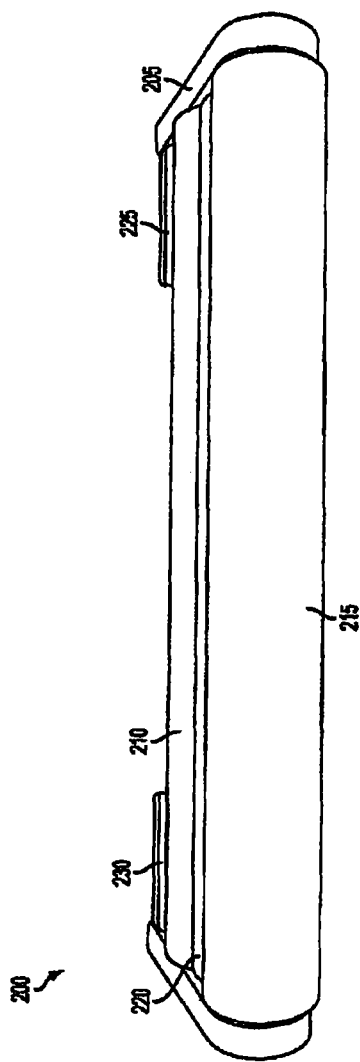
FIG. 2D illustrates a front perspective view of a roller apparatus according to one or more embodiments described herein.
Figure 2F:
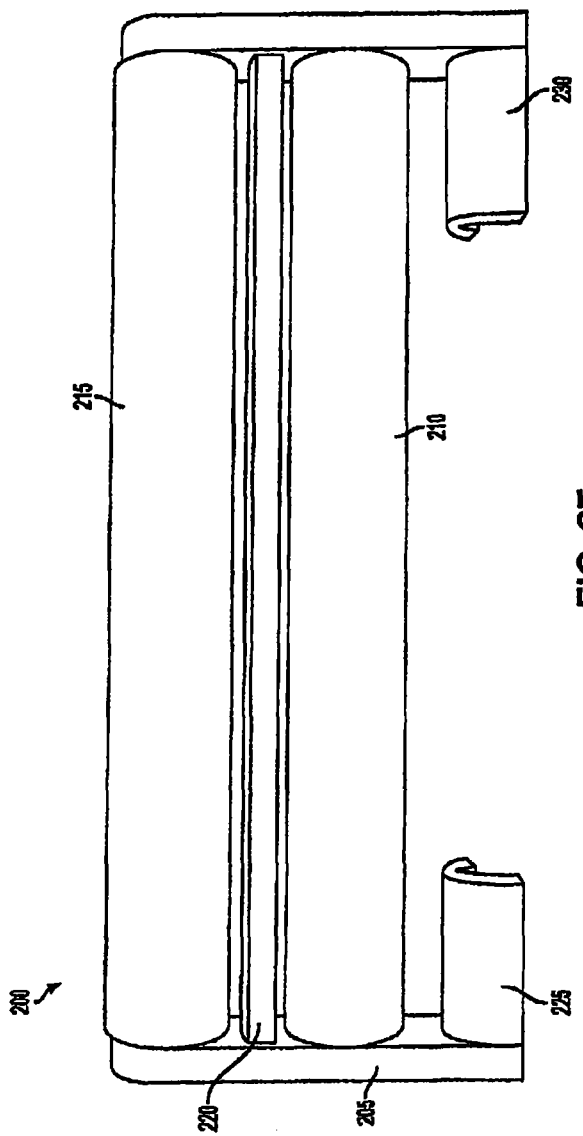
FIG. 2F illustrates a bottom view of a roller apparatus according to one or more embodiments described herein.

FIGS. 2D, 2E and 2F show other various views of one embodiment of the roller apparatus 200.

Figure 2G:
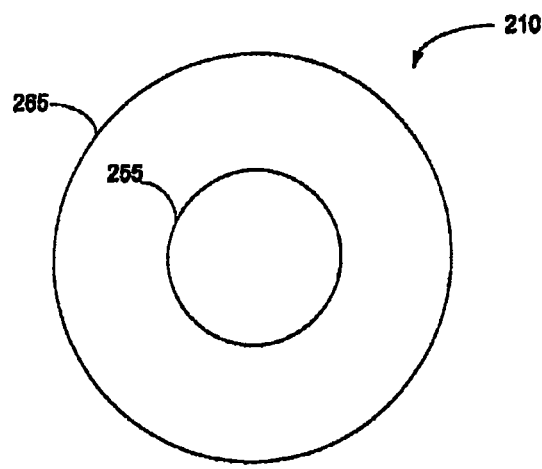
FIG. 2G illustrates a cross-sectional view of the first roller according to one or more embodiments described herein.

FIG. 2G illust'rates a cross-sectional view of the first roller 210. All principles of the first roller 210 discussed herein may be equally applicable to the second roller 215. As shown, the outer core 265 may wrap the entirety of the inner core 255. In addition, the inner core 255 may have a substantially smaller diameter than the outer core 265. In one embodiment, the inner core 255 may be constructed out of a rigid material such as metal, wood, a hard plastic, etc. The outer core 265 may be constructed out of a different, non-rigid or semi-rigid material such as a rubber, a soft plastic or a polymer. In one embodiment, the material used to construct the inner core 255 may be the same as the material used to construct the outer core 265. However, in one embodiment, the densities of the material may be different. For example, the materials used to construct the outer core 265 may be less dense and/or have a lower durometer rating. By having a softer outer core 265, the roller apparatus 200 may be able to press the film (e.g., film 150) onto the device (e.g., electronic device 135) without causing surface damage. The softer material of the outer core 265 also helps to more effectively and advantageously remove the air bubbles between the film 150 and the screen of the electronic device 135.

Turning to FIG. 3A, an operation of the application process will now be discussed. As shown, a user may apply part of an adhesive portion 355 of a film 350 by removing a part of the backing portion 360 of the film 350 and lining up the adhesive portion 355 to a surface (e.g., a screen) of an electronic device 335. The roller apparatus 300 might not be used in this initial set-up step.

Figure 3B:
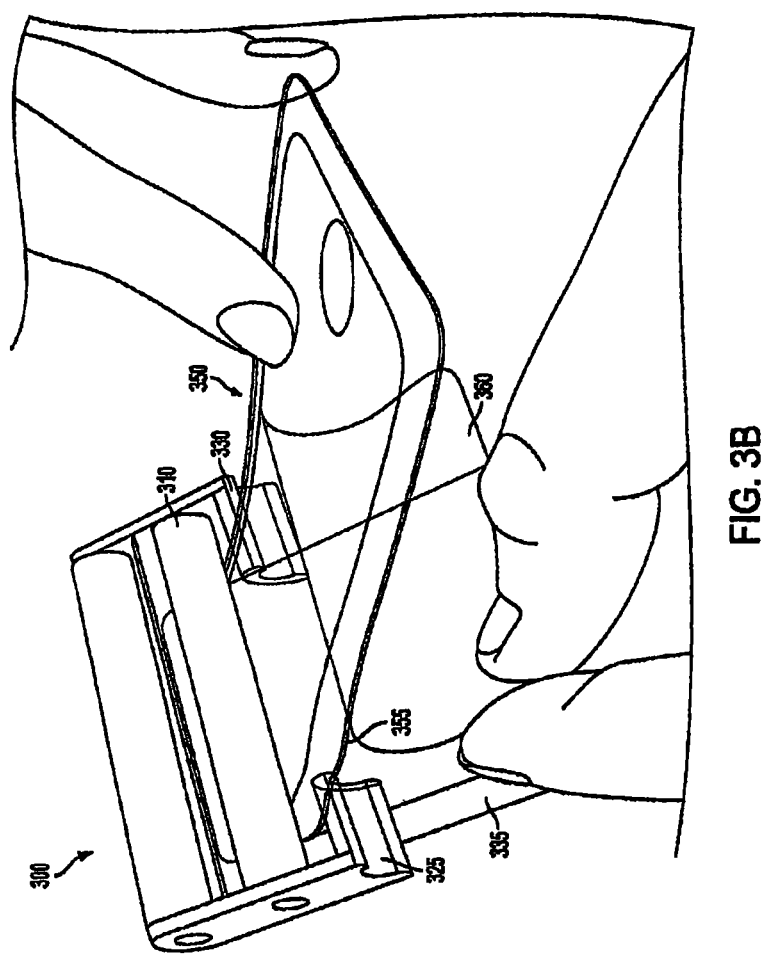
FIG. 3B illustrates a roller apparatus set-up configuration according to one or more embodiments described herein.
Figure 3C:
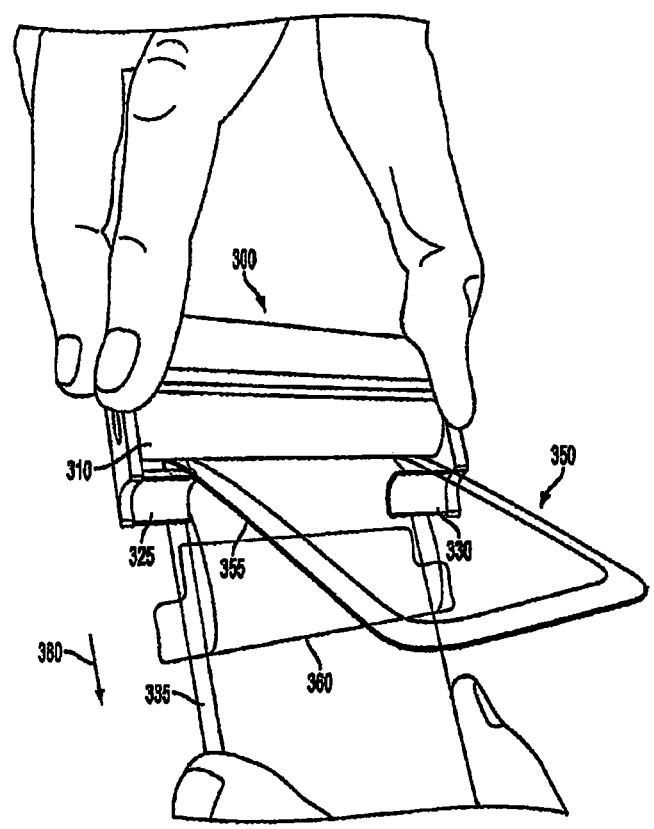
FIG. 3C illustrates a roller apparatus operation configuration according to one or more embodiments described herein.

Next, as shown in FIG. 3B, the roller apparatus 300 may be configured and placed into position for operation. More particularly, the roller apparatus 300 may be placed on top of the film 300 and electronic device 335 with the splitters 325 and 330 between the adhesive portion 355 and the backing portion 360.

Once the roller apparatus 300 is in position, the user may place one hand on the electronic device 335 (for stability) and use the other hand to push (and roll) the film 350 onto the surface of the electronic device 335 by moving the roller apparatus 300 in a downward direction 380. As the roller apparatus 300 moves in the downward direction 380, one or more rollers 310 and 315 press the adhesive portion 355 of the film 350 onto the electronic device 335 and squeeze out any air bubbles that may be trapped between the film 350 and the electronic device 335. Contemporaneously, the splitters 325 and 330 provide a guide for the film 350 (i.e., "lead the way") and remove the backing portion 360 of the film 350, thereby progressively providing more of the adhesive portion 355 of the film 350 for the rollers 310 and 315 to press down on.

After the roller apparatus 300 is pulled through, across or over the length of the electronic device 335, the adhesive portion 355 of the film 350 may be pressed onto the electronic device 335 and the user does not have to perform any other functions with respect to the surface with the applied adhesive portion 355.

Depending on the design of the film 350, this may conclude the application process. However, in certain embodiments, where the film 350 includes "overhanging" portions, the user may simply press these portions down onto the sides of the electronic device 335 to conclude the application process.

In this manner, the user does not have to use a squeegee, wet solution, etc. to remove the air bubbles or to apply the adhesive portion 355 of the film 350 onto the electronic device 335 and the entire application process may be improved with respect to, for example, cleanliness, ease of use and convenience.

FIG. 4A illustrates one embodiment of a roller apparatus 400. The roller apparatus 400 may include an apparatus body 405, a first roller 410 inserted into the apparatus body 405 and held in place by via hole 425 (and its paired hole—not shown). The roller apparatus 400 may also include a second roller (not shown) held in place by hole 430 (and its paired hold—not shown). The roller apparatus 400 may also include a splitter bar 415 and a mid bar 420. The mid bar 420 may be configured to span the length of the first roller 410 and may provide structural support to the roller apparatus 400.

FIG. 4B illustrates how the roller apparatus 400 may be used to apply a protective material 450 onto a device 435. The splitter bar 415 may be used to split or separate an adhesive portion of a protective material 450 from a non-adhesive backing during the application process. As shown, the roller apparatus 400 may be placed on the device 435 with the protective material 450 wedged between the first roller 410 and the electronic device 435. As the roller apparatus 400 is moved along the surface of the electronic device 435, the splitter bar 415 exposes the adhesive portion of the protective material 450 prior to the first roller 410 pressing the adhesive portion of the protective material 450 down onto the surface of the electronic device 435. In addition, the non-adhesive backing is removed during this process.

FIG. 5A illustrates one embodiment of a roller apparatus 500. The roller apparatus 500 may include a body 505, a first roller 520, a second roller 515, a splitter 510, a first pressing surface 525 and a second pressing surface 530. In one embodiment, the roller apparatus 500 may be constructed as one integrated piece. By integrating the first roller 520 and the second roller 515, along with the splitter 510 into the body 505, additional structural components may be eliminated. In one embodiment, the first roller 520 and the second roller 515 may be rod members that might not rotate. In another embodiment, the first roller 520 and the second roller 515 may be rotatable members.

FIG. 5B illustrates how the roller apparatus 500 may be used to apply a film 550 onto a device 535. As shown, the roller apparatus 500 may separate a top non-adhesive portion of the film 550 from the adhesive bottom portion of the film 550 as the user presses on the first pressing surface 525 and the second pressing surface 530 while moving the roller apparatus 500 along the length of the device 535. During such an operation, the splitter 510 may separate the adhesive and non-adhesive portions of the film 550 while the rollers 520 and 515 may apply the adhesive portions of the film 550 to the surface of the device 535. In this embodiment, the device 535 may be sandwiched or be located between the first roller 520 and the second roller 515. The first roller 520 may contact the film 550 (as shown in FIG. 5B) on a first surface (e.g., a screen) of the device 535 while the second roller 515 may contact a second surface (e.g., a backing) of the device 535.

FIG. 6A illustrates a roller apparatus 600, an electronic device 635, a film 650 and an optional film tab 695. The roller apparatus 600 may be used to apply the film 650 to a surface of the electronic device 635. In one embodiment, the film tab 695 may be used to improve the ease of applying the film 650 as further discussed below.

Figure 6B:
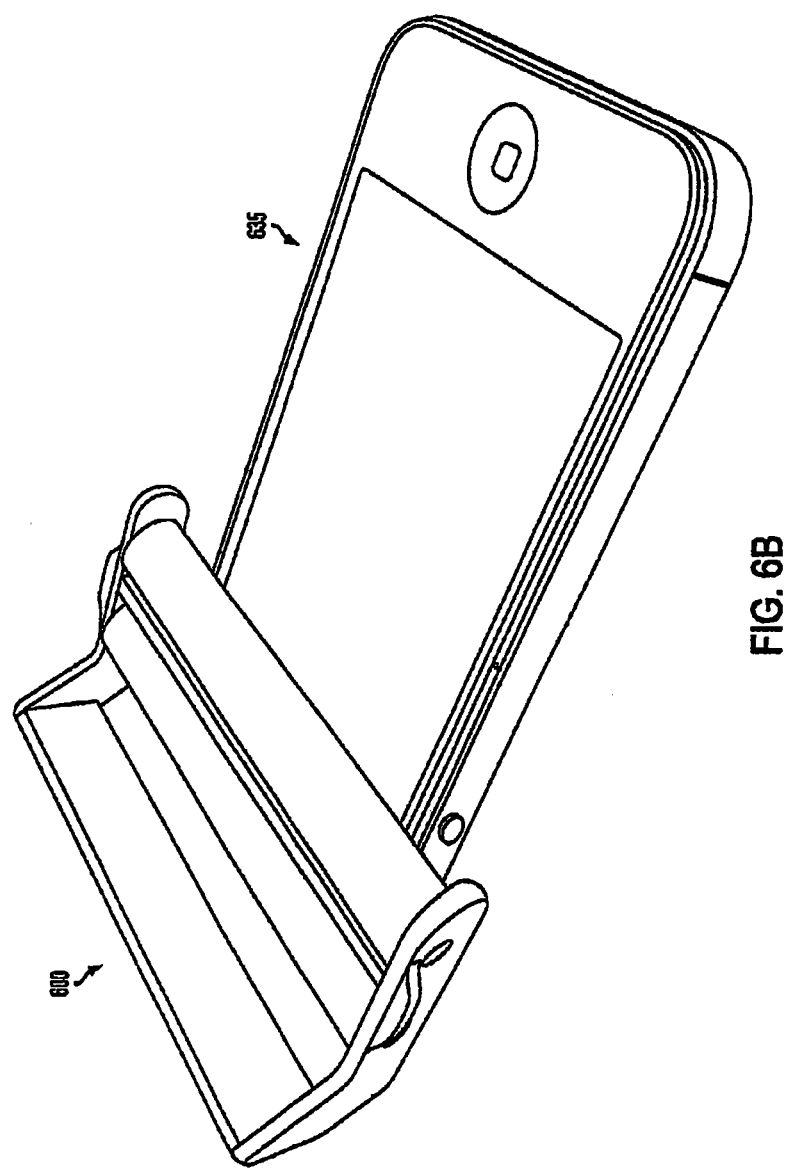
FIG. 6B illustrates a roller apparatus with an integrated stand in a first operation configuration according to one or more embodiments described herein.

FIG. 6B illustrates one embodiment of how the roller apparatus 600 may appear when mounted on the electronic device 635, for example, during a film application process. As shown, the roller apparatus 600 may have a width wider than the width of the electronic device 635. In this manner, the roller apparatus 600 may be configured to apply films of varying sizes onto devices of varying sizes (e.g., a tablet PC). In addition, the roller apparatus 600 may be configured to apply the film 650 to a device with a curved surface (not shown).

Figure 6C:
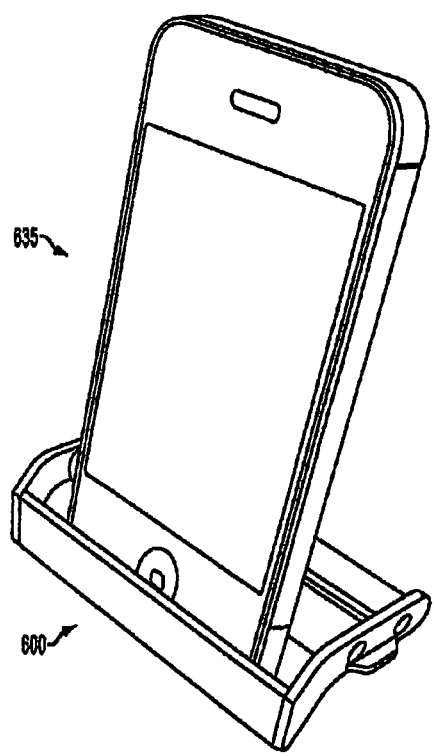
FIG. 6C illustrates a roller apparatus with an integrated stand in a second operation configuration according to one or more embodiments described herein.

However, distinct from the first operation configuration, the roller apparatus 600 may be utilized in a second operation configuration to hold, secure, prop or otherwise position the electronic device 635 such that it may be easier for a user to view and/or use the electronic device 635. For instance, the roller apparatus 600 may be flipped over to a second operation configuration and rest on a flat surface and the like to prop up the electronic device 635 and improve viewing angles of the electronic device 635 to a user. In this manner, the roller apparatus 600 may have continued utility even after a film (e.g., film 650) is applied by the roller apparatus 600 to the electronic device 635. As shown in FIG. 6C, the electronic device 635 sits in an upright manner within a cavity of the roller apparatus 600. In one embodiment, the cavity is defined to be a space between a front bar and a first roller.

Figure 6D:
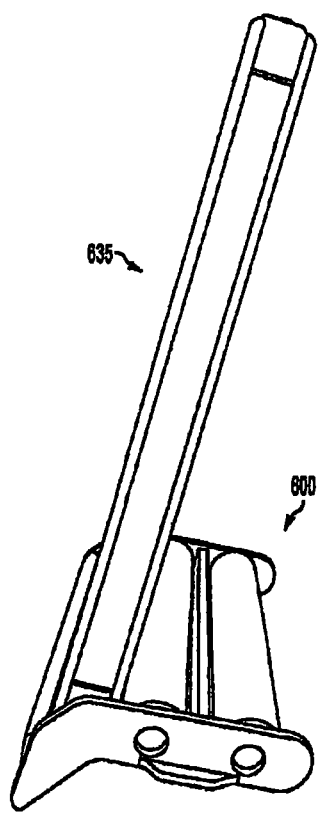
FIG. 6D illustrates a side view of the roller apparatus of FIG. 6C according to one or more embodiments described herein.

FIG. 6D illustrates a side view of the roller apparatus 600 with the electronic device 635 held in an upright manner. As shown in FIG. 6D, the electronic device 635 may sit angled while still being upright. By varying the width of the cavity (i.e., distance between the front bar and the first roller), the positioning of the stand edge and the like, the viewing angle may be adjusted between 90 degrees and 135 degrees. For example, as shown in FIG. 6D, the electronic device 635 may be held at an angle of 120 degrees as measured between a table surface and a viewing surface of the electronic device 635.

Figure 6E:
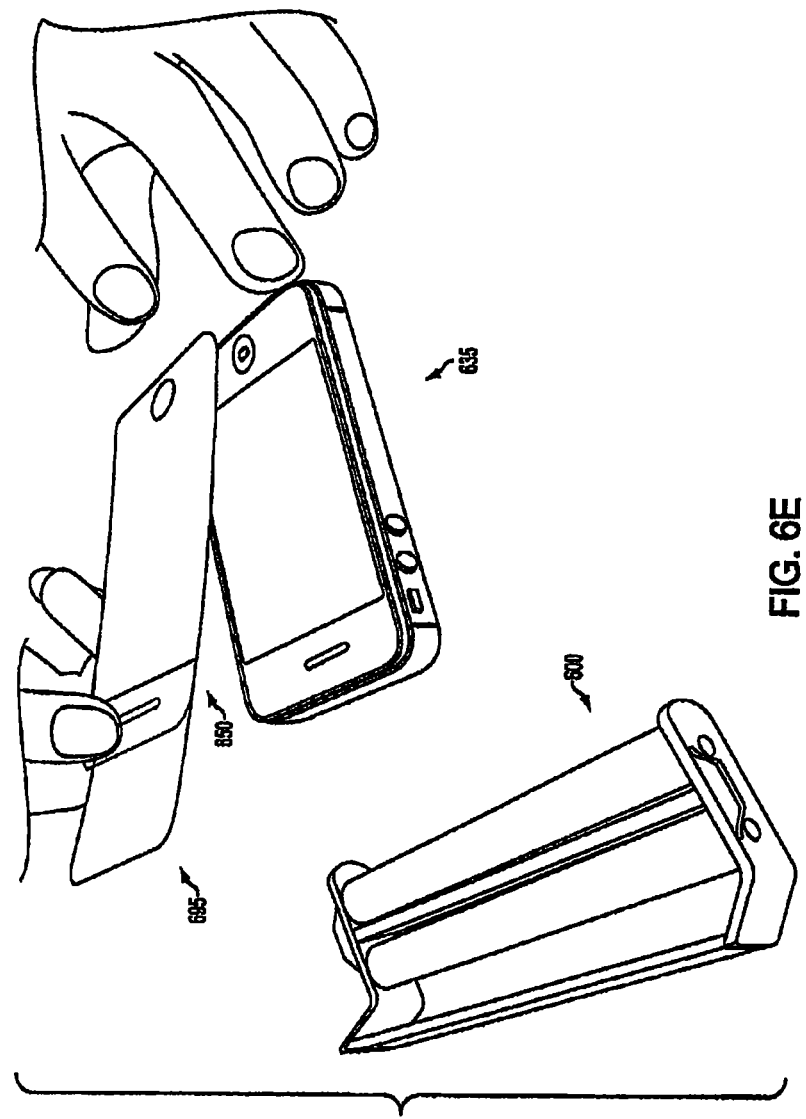
FIG. 6E illustrates a protective material set-up configuration according to one or more embodiments described herein.
Figure 6G:
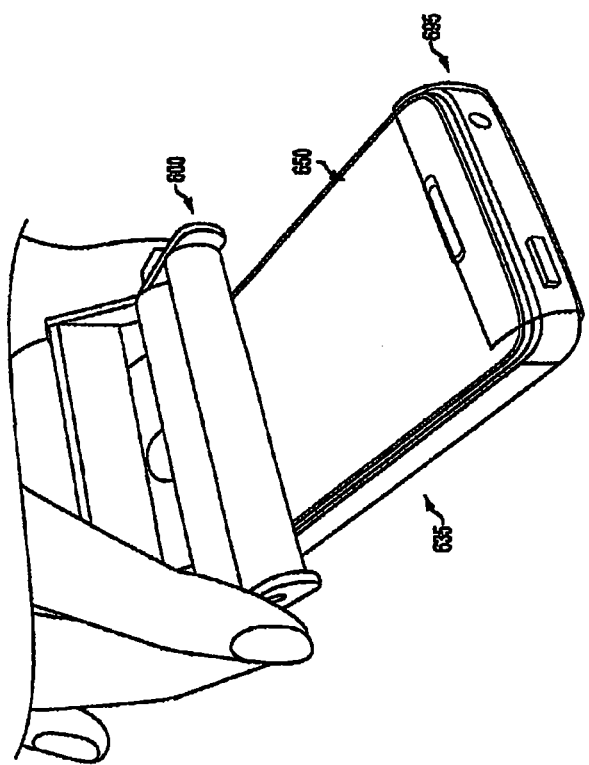
FIG. 6G illustrates a roller apparatus operation configuration according to one or more embodiments described herein.

FIGS. 6E-6G illustrate one example of how the roller apparatus 600 may be utilized to apply the film 650 onto a surface of the electronic device 635. As shown in FIG. 6E, the film tab 695 may be applied (and may adhere) to the film 650 and held in a preliminary application position by a user's hand near the surface of the electronic device 635. The film tab 695 may function to aid the user in lining up the film 650 with the electronic device 635 and simplifying the application process since the user may be able to handle a portion of the film tab 695 without worrying about whether the film 650 will adhere to the user's fingers during the application process. The roller apparatus 600 might not be engaged at this stage. In one embodiment, the film tab 695 may be pre-installed on the film 650 for the consumer's convenience.

Next, as shown by FIG. 6F, a portion of the adhesive portion 655 of the film 650 has been separated from a portion of the non-adhesive film backing 660, and has been pressed onto the surface of the electronic device 635. At this point of the film application process, the user may retrieve the roller apparatus 600. The user may then utilize the roller apparatus 600 and press the adhesive portion 655 of the film 650 to the surface of the electronic device 635 with one hand while moving the roller apparatus 600 in a length-wise direction. Immediately proceeding the moment when the roller apparatus 600 presses one section of the adhesive portion 655 of the film 650 onto the surface of the electronic device 635 to remove any air bubbles, the user may remove a corresponding section of the non-adhesive film backing 660 with the other hand in preparation. In this manner, the adhesive portion 655 of the film 650 may be applied to the surface of the electronic device 635. In addition, any air bubbles between the adhesive portion 655 and the surface of the electronic device 635 resulting from the application process may be removed or squeezed out by the roller apparatus 600 being pressed and maneuvered.

FIG. 6G illustrates an example of how the user may utilize the roller apparatus 600 to apply the film 650 to the surface of the electronic device 635 while removing any air bubbles. Once the adhesive portion 655 of the film 650 is applied to the surface of the electronic device 635, the film tab 695 may be removed by peeling (not shown) it from the film 650. In this quick and efficient manner, the application process may be completed.

Figure 7B:
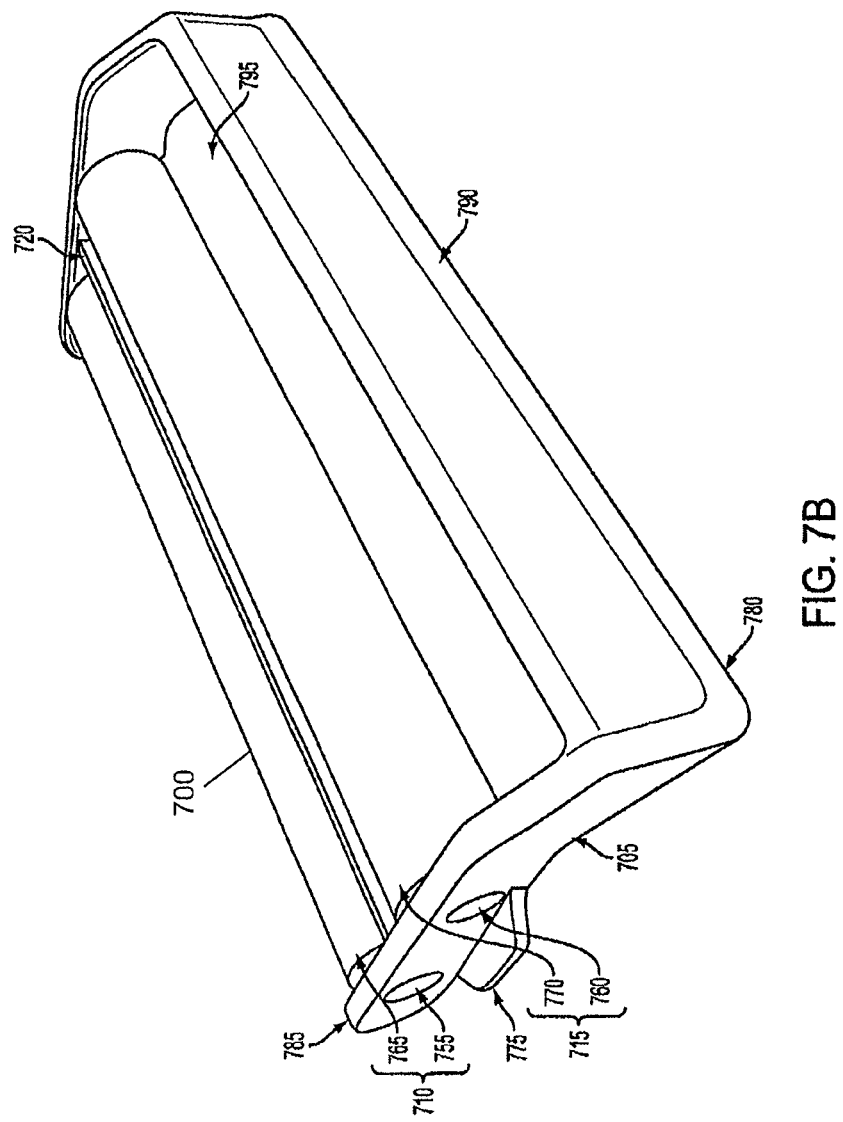
FIG. 7B illustrates a perspective bottom view of a roller apparatus with an integrated stand according to one or more embodiments described herein.

FIG. 7A illustrates an embodiment of a roller apparatus 700 with an integrated stand. The roller apparatus 700 may be an embodiment of the roller apparatus 600 of FIG. 6. As shown, the roller apparatus 700 may be in a first operational position with rollers 710 and 715 in contact with the flat surface beneath it (e.g., table). The roller apparatus 700 may include a body or carriage 705 configured to provide structural support for the rollers 710 and 715. The carriage 705 may include attached or integrated handle portions 775, a mid bar 720 and two contact edges 780 and 785 separated by the rollers 710 and 715. The rollers 710 and 715 may include inner and outer cores 755, 760 (shown in FIGS. 7B and 7C), 765 and 770). The carriage 705 may also include a device insertion portion 795 for insertion of the electronic device (e.g., electronic device 635). However, the device insertion portion 795 may be intended for usage when the roller apparatus 700 is flipped over, as shown in FIG. 7B.

In one embodiment, the handle portions 775 may be configured to allow a user to press down on the handle portions 775 to transfer pressure onto the rollers 710 and 715 during a protective film application process. When the user presses down on the handle portions 775 and maneuvers the roller apparatus 700 along the length of a protective film (e.g., film 650), a force may be transferred to the rollers 710 and 715, which in turn applies a pressure to the protective film (e.g., film 650) resulting in adherence of the film (e.g., film 650) to a surface (e.g., a screen) of the electronic device (e.g., electronic device 635). In addition, any air bubbles may be eliminated due to the pressure applied by the rollers 710 and 715.

The carriage 705 may be constructed out of a rigid material such as a plastic, a metal, a wood and the like. In addition, the carriage 705 may be sized to be easily graspable and manipulated by a user's hand. The carriage 705 may be configured to hold the first roller 710 in place and allow the first roller 710 to "roll" or rotate about a longitudinal axis created by the carriage 705. In one example, the carriage 705 may be structured to include a rod member (not shown) spanning the entire length of the first roller 710, thereby forming an axis for the first roller 710 to rotate about. In another example, the carriage 705 may include two insertion portions opposite each other for inserting a rotational member of a first roller 710.

The first roller 710 may be configured to apply physical pressure on a film (e.g., film 650) in operation. The second roller 715 may be a redundant pressure applicator and may be substantially the same size as, and parallel to the first roller 710. The first roller 710 and the second roller 715 may be separated by a mid bar 720. The mid bar 720 may connect the two ends of the carriage 705 and provide the entire roller apparatus 700 with stability. In addition, gaps between the mid bar 720 and the rollers 710 and 715 may allow the rollers 710 and 715 to rotate freely without contacting the mid bar 720.

In one embodiment, the roller apparatus 700 may be configured to function as a film applicator for phone-sized devices and may have a length of 1-2 inches, a width of 2-4 inches, and a height of 0.5-1 inches. In one embodiment, the roller apparatus 700 may be configured to function as a film applicator for tablet-sized devices and may have a length of 1-5 inches, a width of 8-12 inches, and a height of 0.5-2 inches. Other dimensions are also possible depending on the size of the device to be protected and/or the size of the film to be applied.

In one embodiment, the mid bar 720 may be curved or straight, and may have a length substantially equivalent to the length of the rollers 710 and 715, thereby joining the two ends of the carriage 705. Additionally, the mid bar 720 may be configured have a width shorter than a diameter of the outer cores 765 and 770. In this manner, the mid bar 720 provides structural support to the roller apparatus 700 without contacting the film (e.g., film 750) or the device (e.g., electronic device 735) during the film application process.

In one embodiment, the contact edge 780 may be raised and further away from the flat surface (e.g., the table) than, for example, the rollers 710 and 715 when the roller apparatus 700 is positioned as shown in FIG. 7A.

As shown in FIG. 7B, when the roller apparatus 700 is flipped over, the contact edge 780 raises the rollers 710 and 715 off a flat surface (e.g., a table) and also orients the device insertion portion 795 such that insertion and propping of the electronic device (e.g., electronic device 635) is possible. As more clearly shown in FIG. 7C, when the roller apparatus 700 is in this position, the second roller 715 may be raised off the table and may allow for the electronic device (e.g., electronic device 635) to rest on an outer core 770 of the second roller 715. More particularly, the electronic device (e.g., the electronic device 635) may be contacted on a first surface by the second roller 715 and contacted on a second surface by the stand portion 790 as it sits within the insertion portion 795. In one embodiment, the stand portion 790 may be a flat panel having a length substantially similar to a length of the first roller 710 and the second roller 715. As shown, the stand portion 790 may be offset from the first roller 710 and the second roller 715. In other words, the stand portion 790 may be separated from the first roller 710 and the second roller 715 by a gap constituting the device insertion portion 795.

Figure 7C:
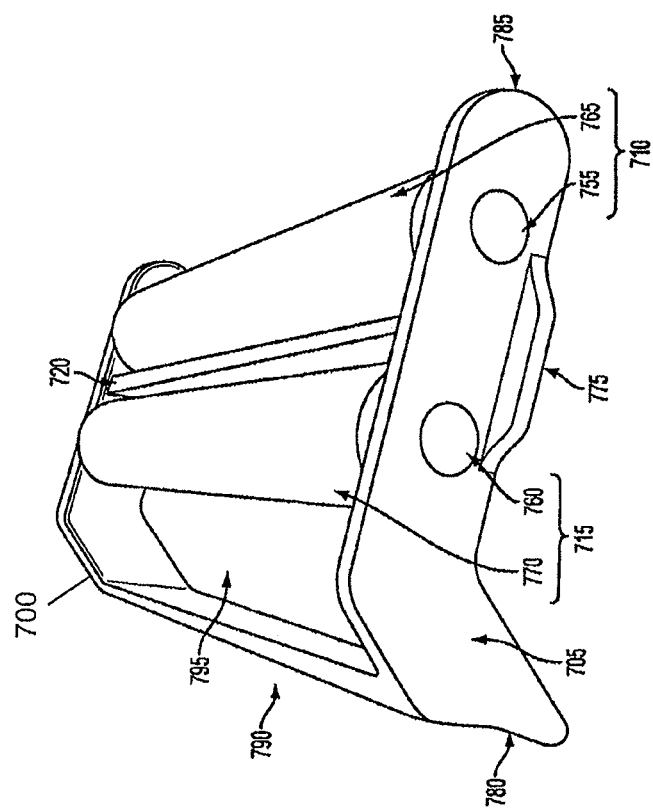
FIG. 7C illustrates a perspective side view of a roller apparatus with an integrated stand according to one or more embodiments described herein.

FIG. 7C is a side perspective view of the roller apparatus 700 in its second operation configuration. As shown, the rollers 710 and 715 may include the inner cores 755 and 760, respectively. In addition, the rollers 710 and 715 may include the outer cores 765 and 770, respectively. In one embodiment, the inner cores 755 and 760 may be constructed out of the same material (e.g., a rigid material such as metal, wood, and a hard plastic). Similarly, the outer cores 765 and 770 may be constructed out of the same material (e.g., rubber, a soft plastic, an encapsulated gel, etc.) or a softer material. In one embodiment, the material used to construct the inner cores 755 and 760 may be the same as the material used to construct the outer cores 765 and 770. However, the densities of the material may be different. For example, the materials used to construct the outer cores 765 and 770 may be less dense and/or have a lower durometer rating. By having softer outer cores 765 and 770, the roller apparatus 700 may be able to press the film onto the device (e.g., electronic device 635) without damaging the surface. In one embodiment, the outer cores 765 and 770 may be configured to "flatten" at the point of contact and thereby providing pressure in a more uniform and distributed manner, efficiently eliminating air bubbles. The outer cores 765 and 770 may be configured to return to its original configuration when not pressed to the surface of the device (e.g., electronic device 635).

Figure 7E:
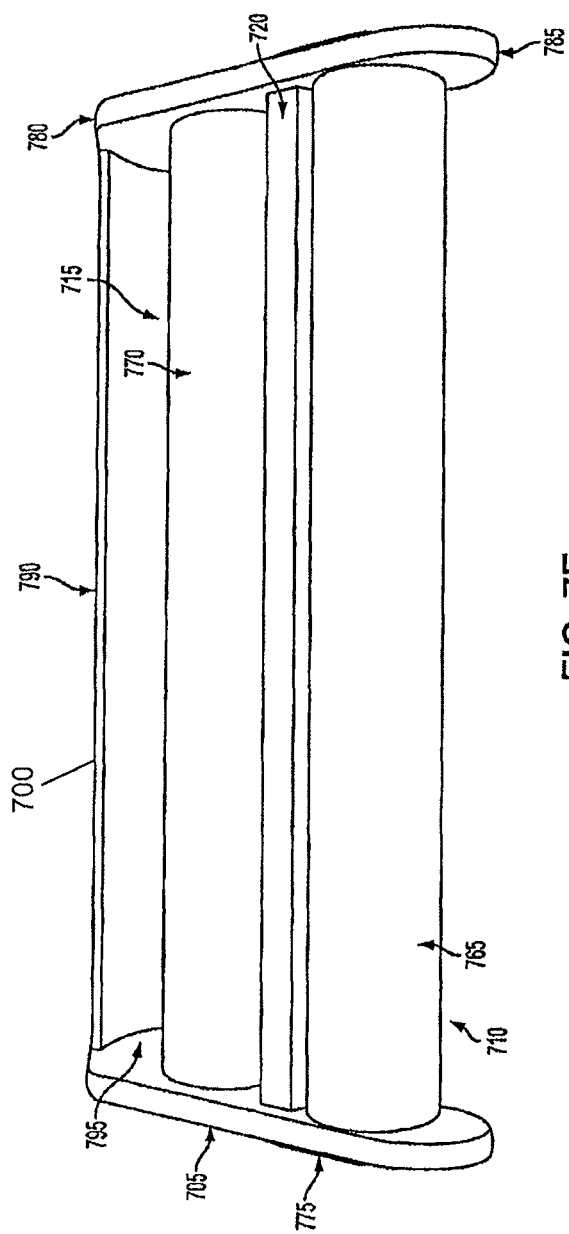
FIG. 7E illustrates a perspective front view of a roller apparatus with an integrated stand according to one or more embodiments described herein.

FIG. 7D and FIG. 7E show other various views of one embodiment of the roller apparatus 700.

Figure 8A:
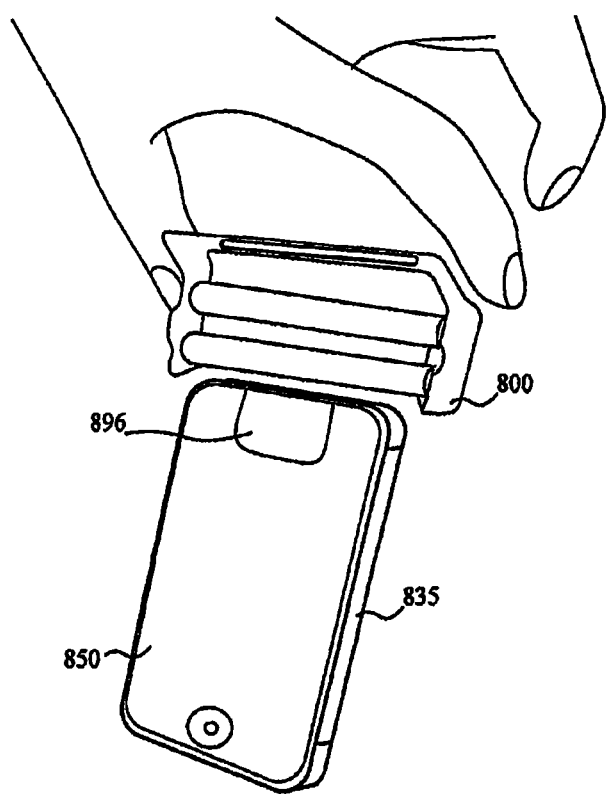
FIG. 8A illustrates a roller apparatus with an integrated stand in a first operation configuration according to one or more embodiments described herein.

FIG. 8A illustrates a roller apparatus 800 with an integrated stand in a first operation configuration according to another embodiment of the present invention. Generally, the roller apparatus 800 may function similarly to roller apparatus 600 and 700. More particularly, FIG. 8A illustrates the roller apparatus 800 in position to perform a film application process to apply a film 850 to the top surface of an electronic device 835. As shown, the roller apparatus 800 may have a width wider than the width of the electronic device 835. In this manner, the roller apparatus 800 may be configured to apply films of varying sizes onto devices of varying sizes (e.g., a tablet PC). In addition, the roller apparatus 800 may be configured to apply the film 850 to a device with a curved surface (not shown). Here, in preparing to apply the film 850 to the electronic device 835, the film 850 may be placed on the surface of the electronic device 835 with a film tab 896 positioned between the film 850 and the surface of the electronic device 835 to be protected. Further details of the structure of the roller apparatus 800 and the film application process are discussed below with respect to FIGS. 8C-8G.

Figure 8B:
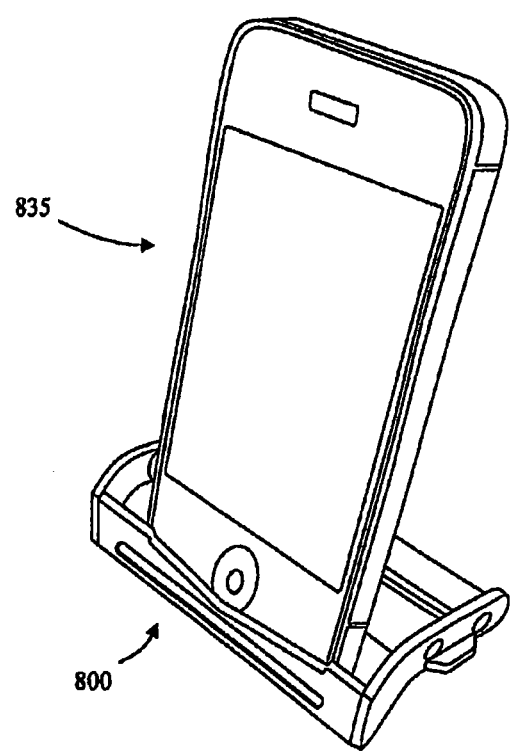
FIG. 8B illustrates a roller apparatus with an integrated stand in a second operation configuration according to one or more embodiments described herein.

However, as shown in FIG. 8B, distinct from the first operation configuration, the roller apparatus 800 may be utilized in a second operation configuration to hold, secure, prop or otherwise position the electronic device 835 such that it may be easier for a user to view and/or use the electronic device 835. For instance, the roller apparatus 800 may be flipped over to a second operation configuration and rest on a flat surface and the like to prop up the electronic device 835 and improve viewing angles of the electronic device 835 to a user. In this manner, the roller apparatus 800 may have continued utility even after a film (e.g., film 850) is applied by the roller apparatus 800 to the electronic device 835. As shown in FIG. 8B, the electronic device 835 sits in an upright manner within a cavity of the roller apparatus 800. In one embodiment, the cavity is defined to be a space or opening within the roller apparatus 800.

Figure 8C:
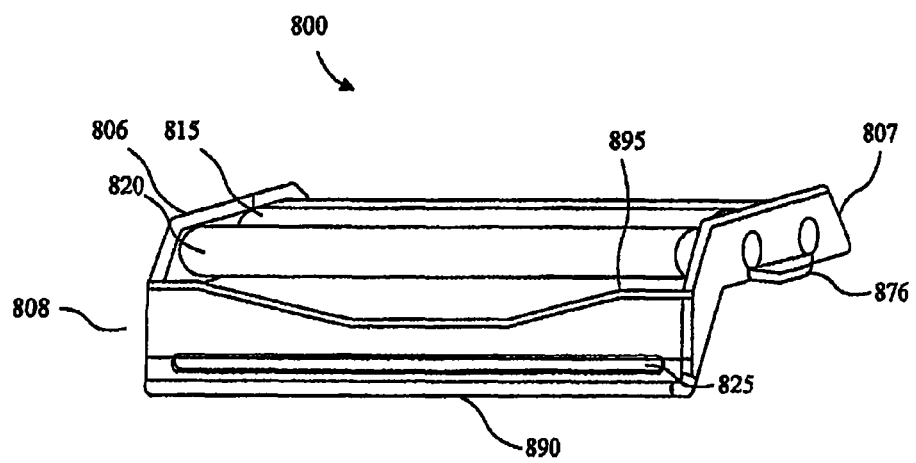
FIG. 8C illustrates a perspective bottom view of a roller apparatus with an integrated stand according to one or more embodiments described herein.

FIG. 8C illustrates a perspective bottom view of the roller apparatus 800 with an integrated stand. One main difference between the roller apparatus 800 and the roller apparatus 600 and 700 is that the former further includes a slit or slot 825 for receiving and guiding the film (e.g., film 850 shown in FIG. 8B) during the film application process. As shown, the roller apparatus 800 may include a body 805 comprising a first side panel 806, a second side panel 807 integrated with a stand portion 808 having the slit 825. The first side panel 806 and second side panel 807 may be substantially parallel and include holes or openings to hold therebetween a first roller 815 and a second roller 820 and to allow the rollers 815 and 820 to rotate during usage to apply the film. The first roller 815 and the second roller 820 may be separated by a mid portion. The first roller 815 and the second roller 820 may be similar to the other first and second rollers described herein (e.g., first and second rollers 715 and 720). The side panels 806 and 807 may each integrate a pressing portion (e.g., pressing portion 876—the other pressing portion is hidden from view) to allow the user to press on and thereby exert pressure on the rollers 815 and 820 during the film application process. The roller apparatus 800 may also include a contact edge 890 and a non-contact edge 895 to define how the roller apparatus 800 is positioned to be operable in the second operation configuration. The contact edge 890 is operatively configured to contact a table surface and position the roller apparatus 800 to be able to receive and hold upright the electronic device 835. As is shown, the non-contact edge 895 might not contact either the electronic device or the table surface in the second operation configuration.

Figure 8D:
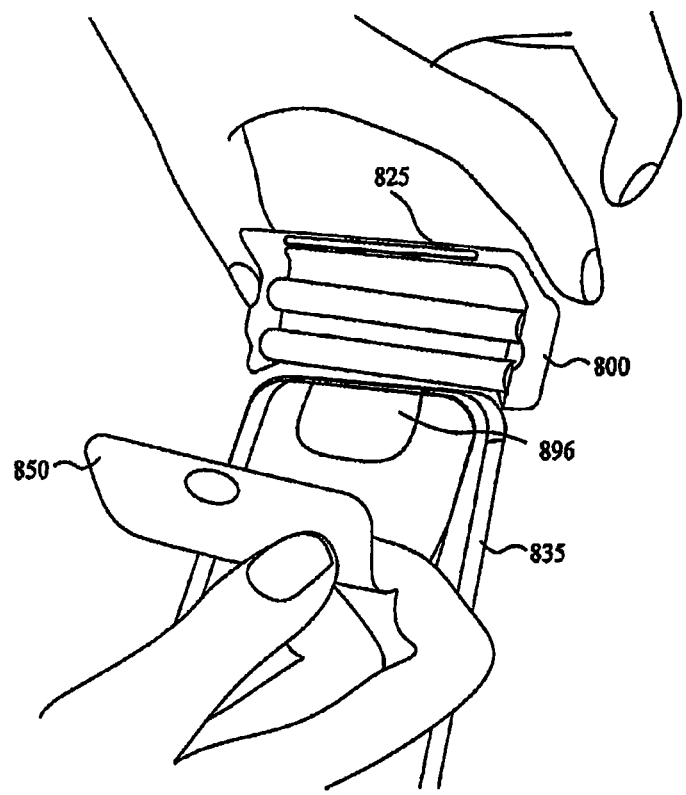
FIG. 8D illustrates a roller apparatus operation configuration according to one or more embodiments described herein.

The operational configurations and the structure of the roller apparatus 800 having been described, attention will now be turned to the film application process. As shown in FIG. 8D, the user may position the film 850 having the backing still attached substantially in the position that the film 850 would be in after application. Here, the film 850 may be temporarily adhered to the electronic device 835 via a film tab 896. When positioned as shown, the user may bend the non-adhered portion of the film and move it towards the slit 825 of the roller apparatus 800.

Figure 8E:
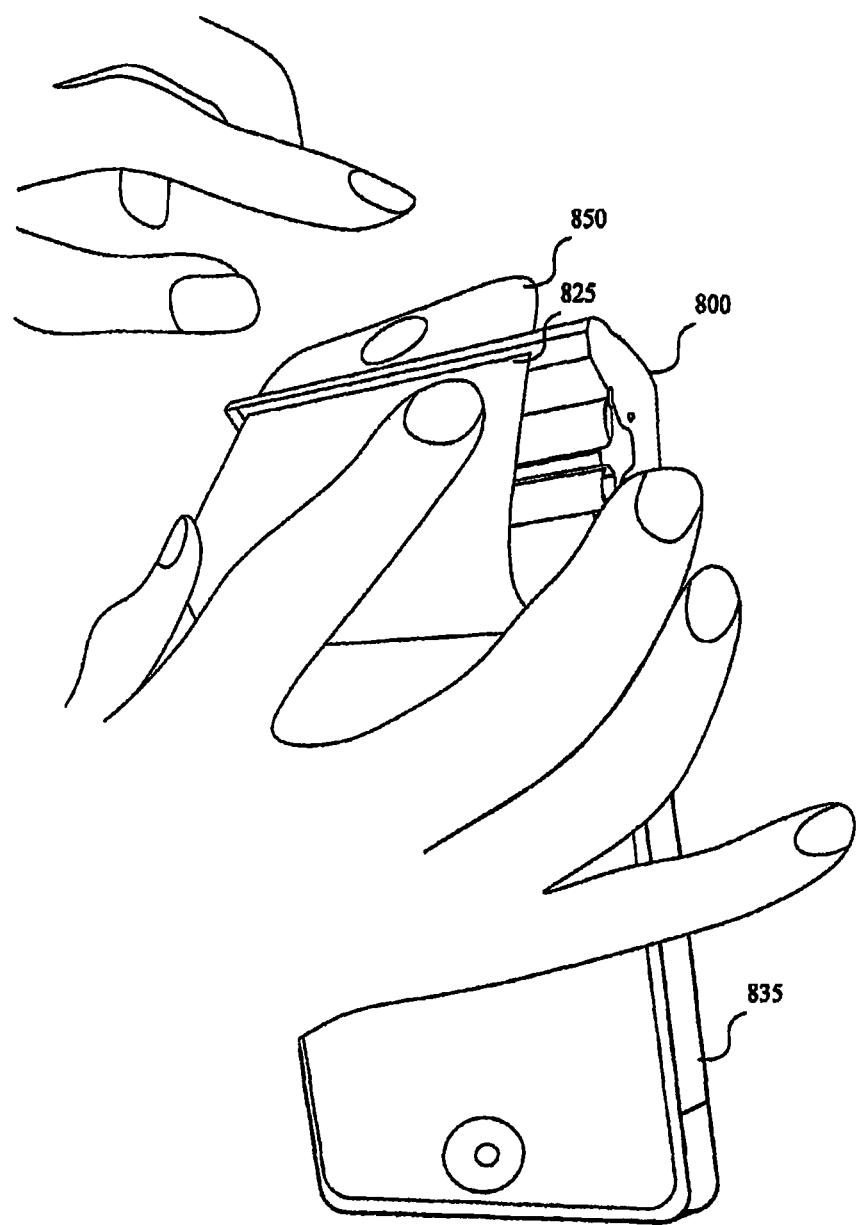
FIG. 8E illustrates a roller apparatus operation configuration according to one or more embodiments described herein.
Figure 8F:
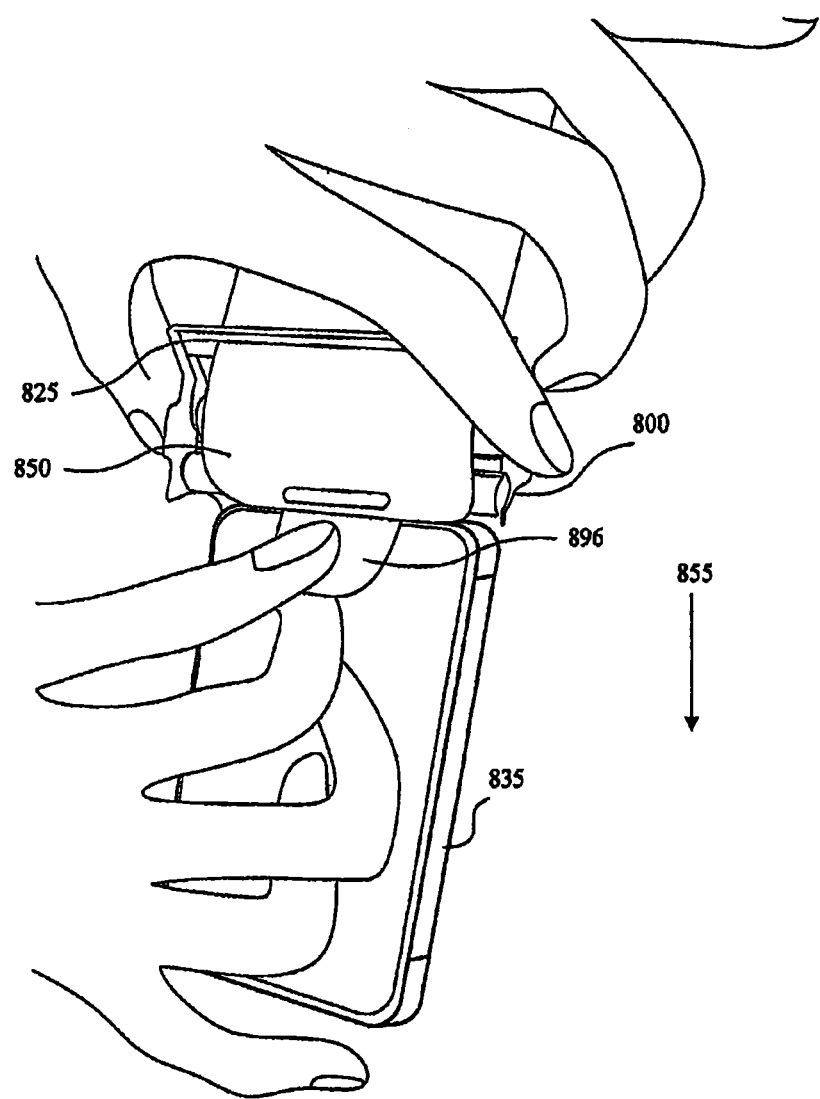
FIG. 8F illustrates a roller apparatus operation configuration according to one or more embodiments described herein.
Figure 8G:
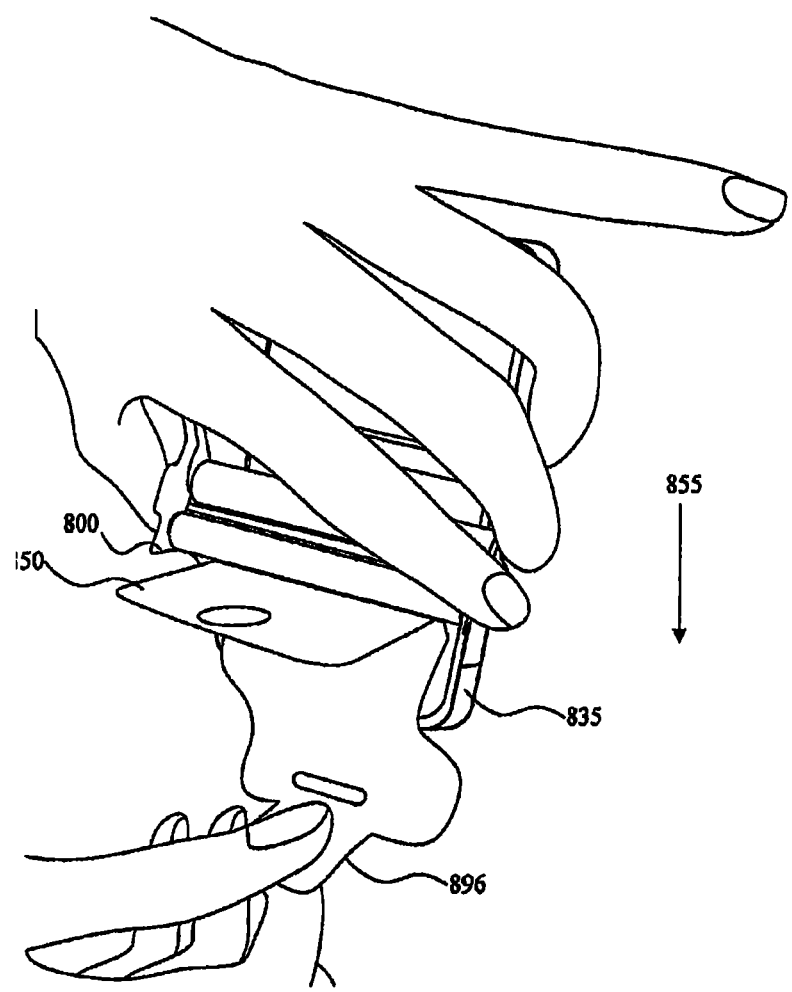
FIG. 8G illustrates a roller apparatus operation configuration according to one or more embodiments described herein.

FIG. 8E illustrates the film 850 as inserted through the slit 825. As shown in FIG. 8F, as the film 835 is inserted through the slit 825, the film tab 896 becomes exposed to the user. With one hand holding the roller apparatus 800, the user may use his or her other hand to begin pulling the film tab 896 in the direction shown by arrow 855 and separate the protective layer of the film from the backing. As shown in FIG. 8G, as the user continues to pull the film tab 896 with one hand and exposes the protective layer of the film, the user may begin to move the roller apparatus 800 with the other hand also in the direction shown by arrow 855 to press the exposed portion of the protective layer to the electronic device 835. In this manner, the user may progressively apply the protective layer to the electronic device 835 until the protective layer is completely separated from the backing and completely applied to the electronic device 835. Optionally, the user may use the roller apparatus 800 to further redundantly press the protective layer to ensure a thorough application. As discussed above, even after the completion of the application process, the roller apparatus 800 may still retain utility as a device stand (e.g., described as the second operational configuration).

Any of the roller apparatus as discussed herein may be used to apply a protective film onto the surface of a mobile communication device. However, to further assist the user in applying the protective film, a roller apparatus guide 900 may be used in conjunction with a roller apparatus (e.g., roller apparatus 800).

Figure 9A:
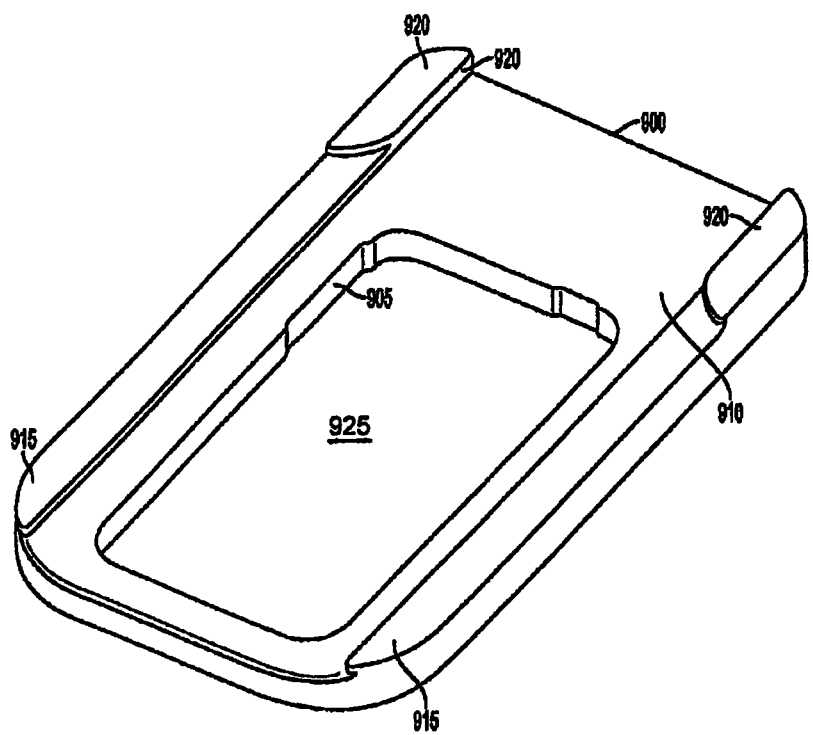
FIG. 9A illustrates a roller guiding apparatus according to one or more embodiments described herein.

As illustrated in FIG. 9A, the roller apparatus guide 900 may be constructed out of materials such as polycarbonate, metal, wood (e.g., a cardboard or thick paper) or any combinations thereof. The roller apparatus guide 900 may be a substantially rectangular block having three or more portions including an inner wall 905 defining a cavity 925 used to receive or mount a mobile communication device, a roller supporting surface 910 configured to be flush with a mounted mobile communication device and a set of roller guiding rails 915 which may be parallel to one another and raised above the roller supporting surface 910. In addition, the roller apparatus guide 900 may include pressing portions 920 to assist the user when applying the protective film. As shown, the roller apparatus guide 900 may be configured to fit a particular mobile communication device with a distinct length, width and height. However, one of ordinary skill will understand that the roller apparatus guide 900 may be designed to fit any mobile communication device of any length, width and height. Indeed, the cavity 925 formed by the inner wall 905 may be sized to be substantially the same as the mobile communication device to be protected. The fit of the mobile communication device within the cavity 925 may be important to ensure that the applied protective film is correctly positioned.

In one embodiment, the cavity 925 formed by the inner wall 905 may be closed on a back side by a thin backing layer spanning the length and width of the cavity 925. The thin backing layer may be integrated into the body of the apparatus guide 900 and constructed out of the same or different material. In this implementation, the cavity 925 may be formed by the inner wall 905 and the thin backing layer and the depth of the cavity 925 may be designed to maintain the feature of the mobile communication device being flush with the top surface of the apparatus guide 900 when placed into the cavity 925. In this manner, the user may be able to use the apparatus guide 900 in various situations where a flat support surface is not readily available.

In one embodiment, the roller apparatus guide 900 may include different removable and insertable portions to enable the roller apparatus guide 900 to fit multiple devices depending on which portions are inserted. For example, consider a first device having dimensions of 5 inches long by 4 inches wide by 1 inch thick and a second device having dimensions of 3 inches long by 2 inches wide by 1 inch thick. The cavity 925 of the roller apparatus guide 900 may initially be designed to fit the larger first device, but not the smaller second device. However, when a molded portion of 5 inches long by 4 inches wide by 1 inch thick having a cavity 925 that is 3 inches long by 2 inches wide by 1 inch thick is inserted in the cavity 925 of the roller apparatus guide 900, the resulting roller apparatus guide 900 may then be utilized to fit the smaller second device. Other molded portions may be swapped in and out depending on the size and shape of the mobile communication device. Alternatively, the user may include further additional portions or remove inserted portions as desired to fit the particular devices. In this manner, roller apparatus guide 900 may be versatile and cater to different mobile communication devices of different sizes.

The structure of the roller apparatus guide 900 having been described, attention will now be turned to the functionality as shown in FIGS. 9B-9H.

Figure 9B:
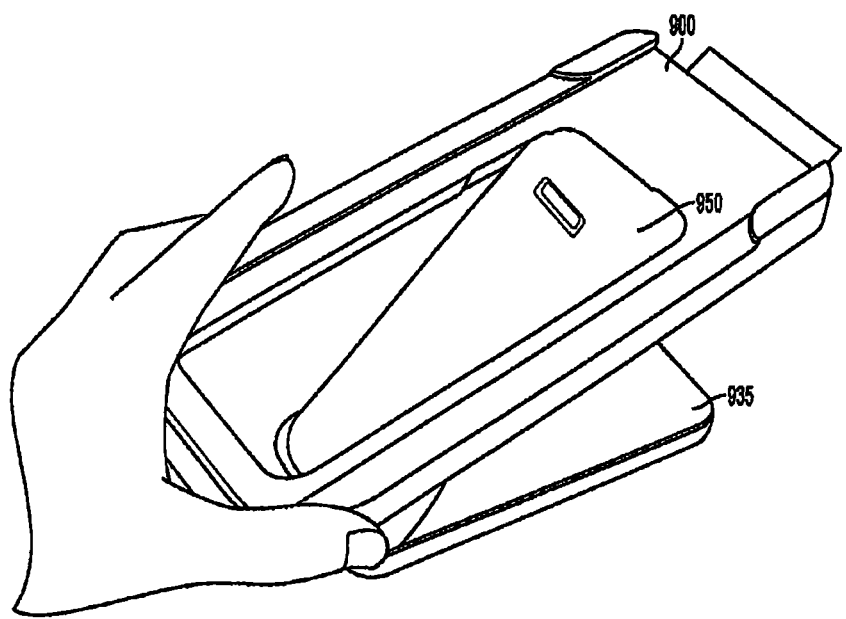
FIG. 9B illustrates a roller guiding apparatus with a film attached prior to mounting of the mobile communication device according to one or more embodiments described herein.

FIG. 9B illustrates the roller apparatus guide 900, a film 950 to be applied, and a mobile communication device 935. The film 950 may be temporarily held to the roller apparatus guide 900 via an adhesive (not shown). As the film 950 is sized to correspond to the mobile communication device 935 (which is to be inserted or mounted by the roller apparatus guide 900), the film 950 may freely move in and out of the cavity 925 as shown.

Figure 9C:
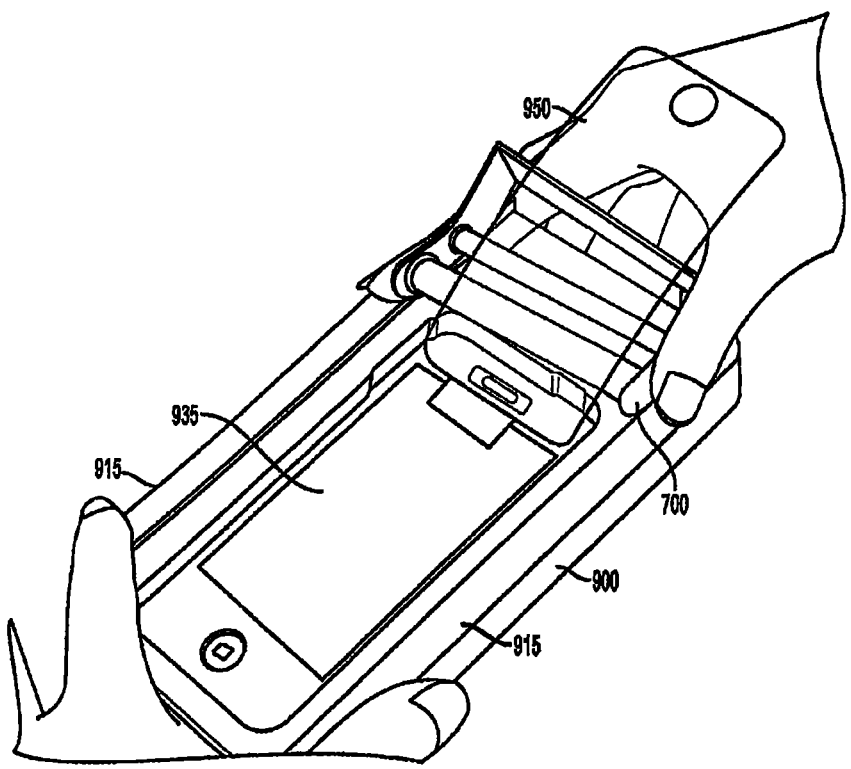
FIG. 9C illustrates a roller guiding apparatus with the mobile communication device mounted according to one or more embodiments described herein.

FIG. 9C illustrates the roller apparatus guide 900 fully mounted on the mobile communication device 935, and with the film 950 in a ready-to-be-applied position. While roller 700 is shown in FIG. 9C, any roller may be used in conjunction with the roller apparatus guide 900. The roller 700 may be placed at the top of the roller apparatus guide 900, with the film-contacting outer cores held between the roller guiding rails 915. The distance between the roller guiding rails 915 may be configured to be the same as the length of the roller

700 thereby forming a path for the movement of the roller 700 along a surface of the mobile communication device 935. In other words, the roller guiding rails 915 create a pathway to prevents the roller 700 from veering off the intended positional direction of application, and thus ensuring that the film 950 is applied at a correct position and providing a simplified methodology for imparting the desired precision during the film application process.

Figure 9D:
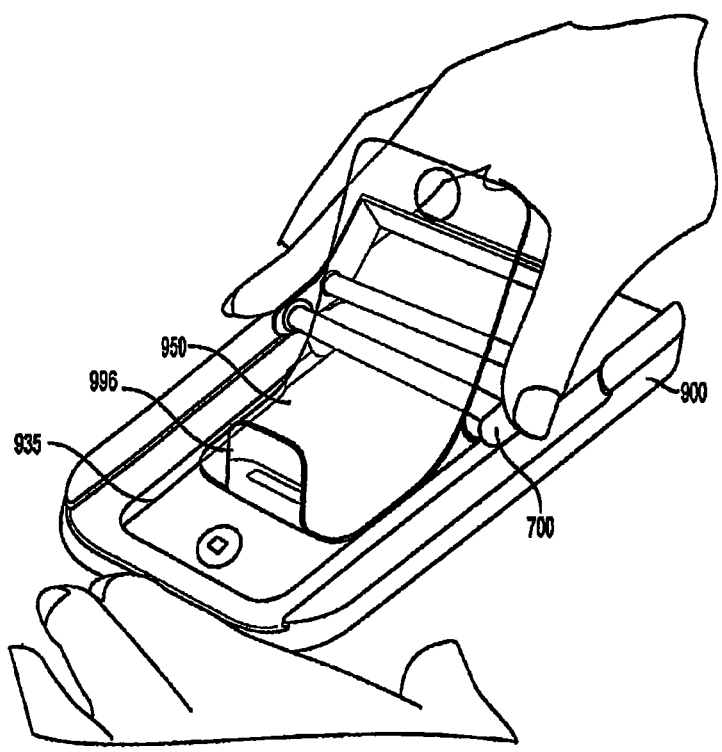
FIG. 9D illustrates a roller guiding apparatus with the mobile communication device mounted and with a roller applying a film on the mobile communication device according to one or more embodiments described herein.

As shown in FIG. 9D, after the user pulls a film tab 996 to expose the protective layer of the film 950 and as the user begins to move the roller 700 from one end of the mobile communication device 935 to the other end of the mobile communication device 935 in the direction of arrow 955, the backing of the film 950 is automatically removed while the exposed protective film is applied to the mobile communication device 935.

Figure 9E:
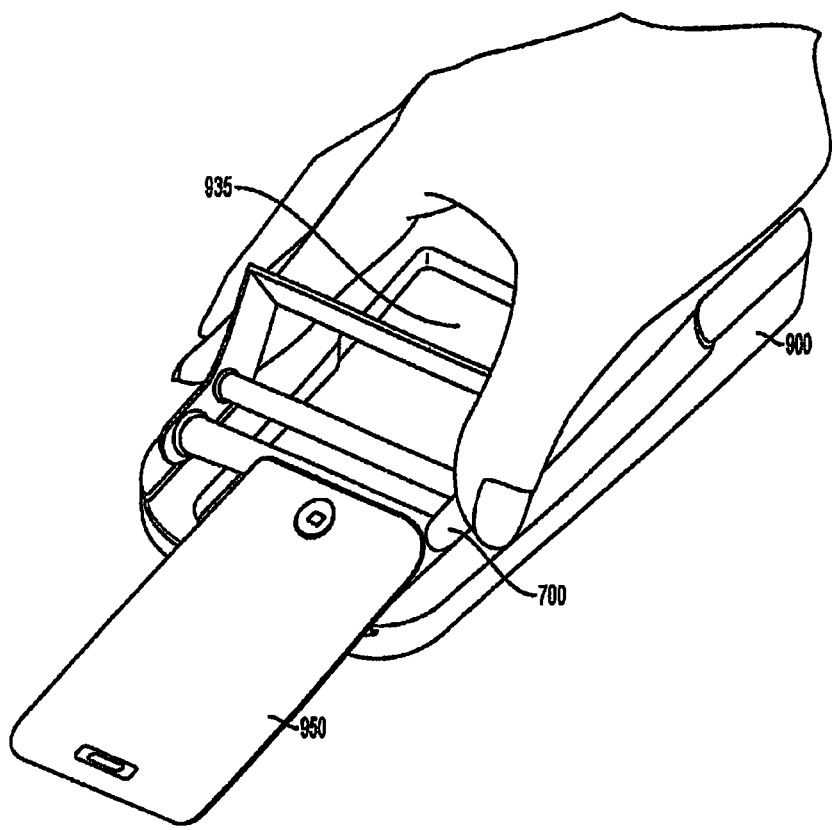
FIG. 9E illustrates a roller guiding apparatus with the mobile communication device mounted and with a roller almost completed with applying a film on the mobile communication device according to one or more embodiments described herein.
Figure 9F:
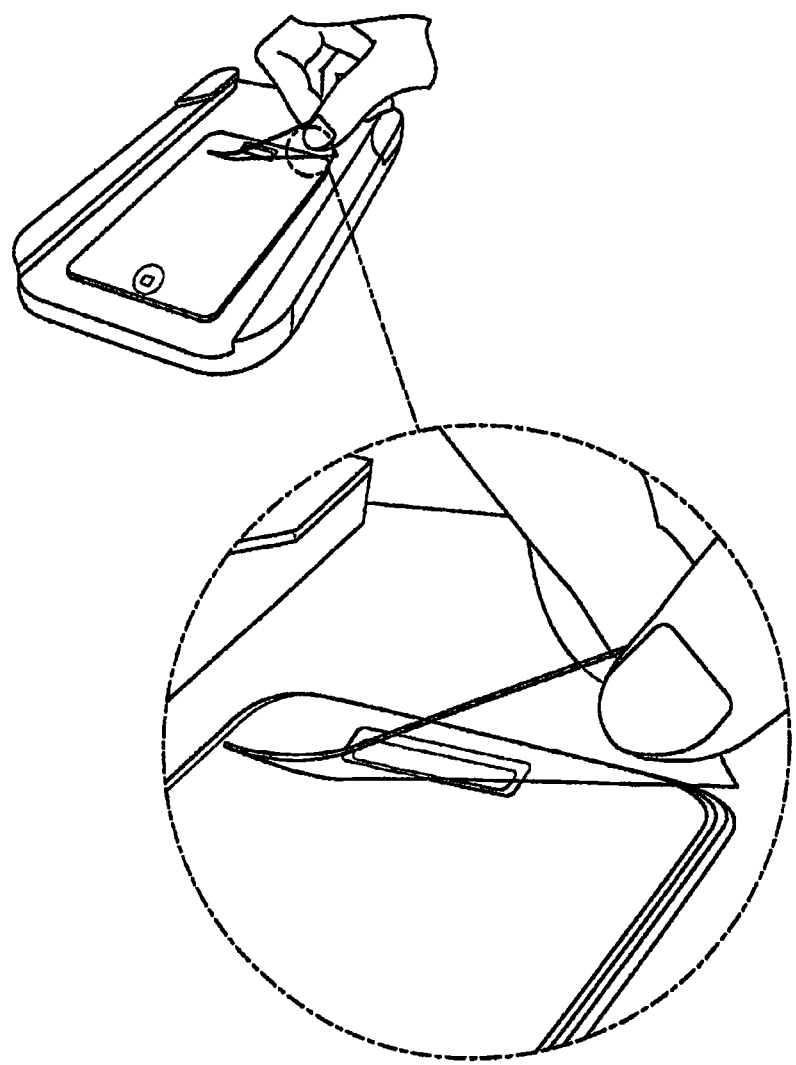
FIG. 9F illustrates a film tab removal process according to one or more embodiments described herein.

FIG. 9E illustrates the roller 700 as the user is about to conclude application of the film 950. As shown, the film backing of the film 950 is substantially separated from the applied portion of the film 950. As shown in FIG. 9F, after the user finishes using the roller 700 to apply the film when the electronic device 935 is situated within the roller guide apparatus 900, the user may remove any adhesive tabs that may have been used to attach the film 900 to the roller guide apparatus 900 for ease of positioning of the film 950 during the application process.

Figure 9G:
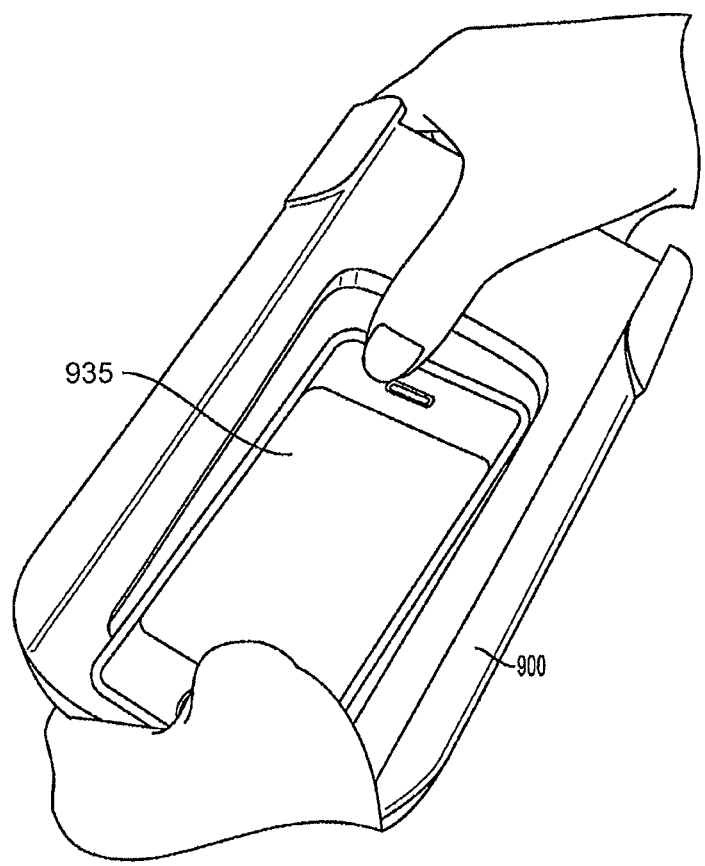
FIG. 9G illustrates removing the mobile communication device from the roller guiding apparatus according to one or more embodiments described herein.
Figure 9H:
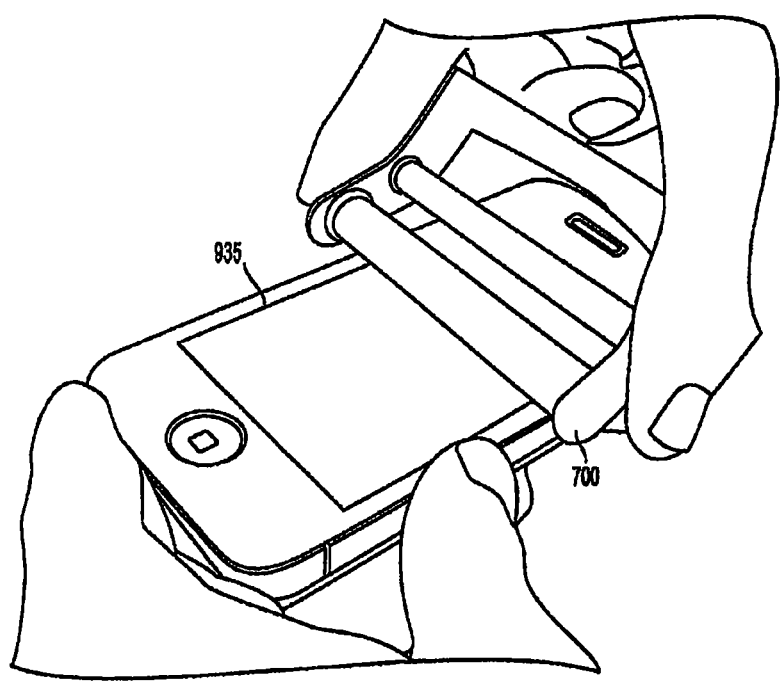
FIG. 9H illustrates reinforcement of the applied film by using the roller after the mobile communication device is removed from the roller guiding apparatus according to one or more embodiments described herein.

As shown in FIG. 9G, the user may remove the mobile communication device 935 from the roller apparatus guide 900 by simply popping it out or lifting the roller apparatus guide 900 off the mobile communication device 935. If desired, the user may use the roller 700 and reinforce the applied film in the manner shown in FIG. 9H.

Figure 10A:
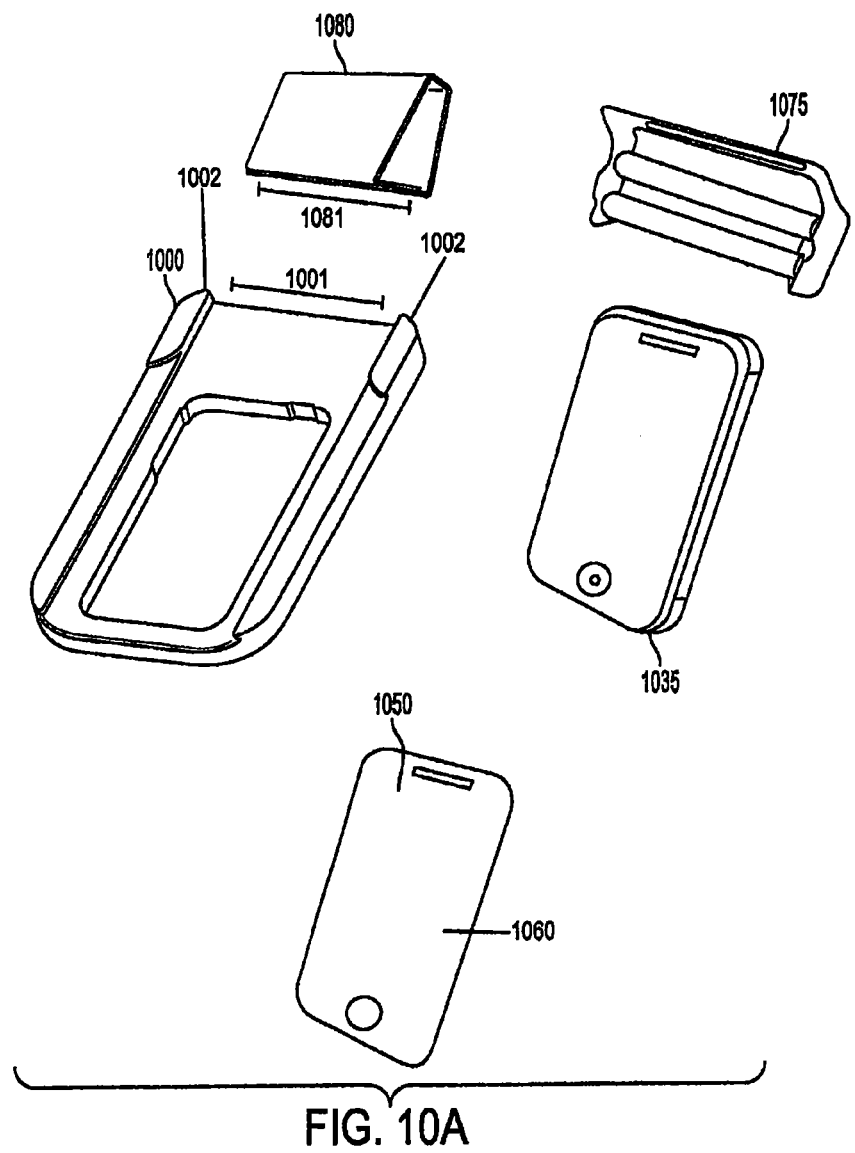
FIG. 10A illustrates a roller apparatus, a mobile communication device, a film to be applied to the mobile communication device, a roller apparatus guide and a wedge according to one or more embodiments described herein.

FIG. 10A illustrates a system including a roller apparatus 1075 (which may be, for example, the roller apparatus 800, 700, 600, etc.), a roller apparatus guide 1000 (which may be, for example, the roller apparatus 900), a mobile communication device 1035, a protective film 1050 (with a backing portion 1060) to be applied to a mobile communication device 1035, and a wedge 1080. Unlike the embodiment illustrated in FIGS. 9A-9G, a wedge 1080 is incorporated in FIG. 10A to help the user apply the film 1050 to the mobile communication device 1035. While not drawn to scale, in one embodiment, a length 1081 of the wedge 1080 may be configured to fit within a distance 1001 between rails 1002.

FIG. 10B illustrates the wedge 1080 apart from the previously described portions of the film application system. The wedge 1080 may be substantially triangular in shape, although minor variations are allowed provided that the functionality of the wedge 1080 remains (as described with respect to FIGS. 10E-10I). The wedge 1080 may comprise three adjacent, connected surfaces 1085, 1090 and 1093 forming the structure of the wedge 1080. The spacing 1095 created by the connecting of surfaces 1085, 1090 and 1093 may be hollow or, in one embodiment, may be filled. As illustrated in FIGS. 10C-10D, the surfaces 1085, 1090 and 1093 may be substantially flat and may have surface areas that are equal or different to one another (e.g., the surface area of the surface 1093 may be 50% smaller than the surface area of the surface 1085 and/or 1090).

As shown in FIG. 10E, the acute angle 1096 created between surfaces 1085 and 1090 may be in the range of 0-90°, but preferably between 5-15°. The angle 1096 is selected to allow the wedge 1080 to be manipulated by the roller 1075 during the application process.

Any of a plurality of materials including paper, cardboard, plastic, metal, wood, or combination thereof may be used to construct the wedge 1080 to facilitate the main functionality of the wedge 1080. The user may initially separate the backing 1060 of the protective film 1050 by pushing the roller apparatus 1075 into the wedge. Advantageously, the user does not need to manually peel the backing 1060, and instead may rely on the wedge 1080, thereby simplifying the process for the user. In other words, the user can simply install the protective film 1050 by moving the roller apparatus 1075 in one smooth, continuous motion.

FIGS. 10E-10J illustrate how the wedge 1080 may be used with the roller apparatus 1075 and the roller guiding apparatus 1000 to apply the film 1050 to the mobile communication device 1035.

Figure 10F:
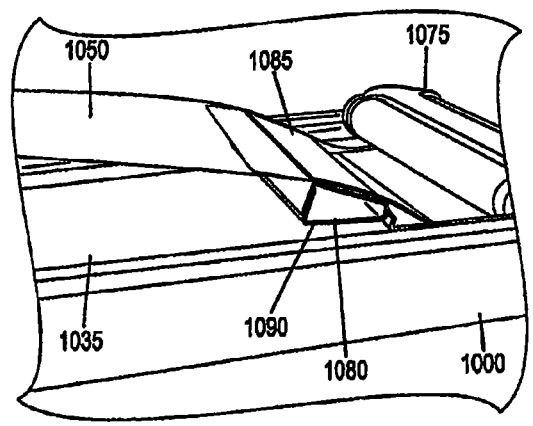
FIG. 10F illustrates a roller guiding apparatus with the mobile communication device mounted and with a roller apparatus initially positioned prior to the applying of a film on the mobile communication device with the assistance of a wedge according to one or more embodiments described herein.

As illustrated in FIG. 10F, initially, the wedge 1080 may be positioned between the film 1050 and the mobile communication device 1035 after the mobile communication device 1035 is mounted by the roller guiding apparatus 1000. Here, the roller apparatus 1075 is placed at the top of the roller guiding apparatus 1000. As shown, in this position, the film 1050 is separated from the surface of the mobile communication device 1035 by the wedge 1080. In this initial position, the surface 1090 of the wedge 1080 contacts the top of the mobile communication device 1035 and/or the top of the roller guiding apparatus 1000 while the other surface 1085 of the wedge 1080 contacts the film 1050. In addition, the surface 1085 adheres to a backing of film 1050 which assists the film application process as illustrated in the following figures.

Figure 10G:
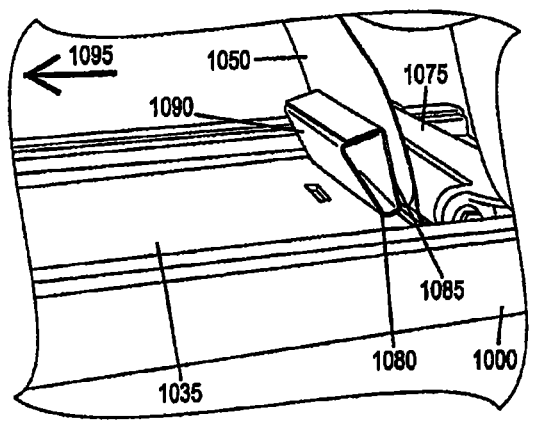
FIG. 10G illustrates a roller guiding apparatus with the mobile communication device mounted and with a roller apparatus initially positioned to apply a film on the mobile communication device with the assistance of a wedge according to one or more embodiments described herein.

FIG. 10G illustrates the behavior of the wedge. As user moves the roller apparatus 1075 across the roller guiding apparatus 1000 in the direction shown by arrow 1095, the roller apparatus 1075 places pressure on the film 1050 and/or the wedge 1080. This in turn causes the surface 1090 to begin to move away from the top surface of the mobile communication device 1035 and/or the top of the roller guiding apparatus 1000, while the surface 1085 continues to adhere to the backing of the film 1050. Furthermore, the configuration of the wedge 1080 and the attachment to the backing portion 1060 of the film 1050 lends itself to be flipped upwards as shown in FIG. 10G.

Figure 10H:
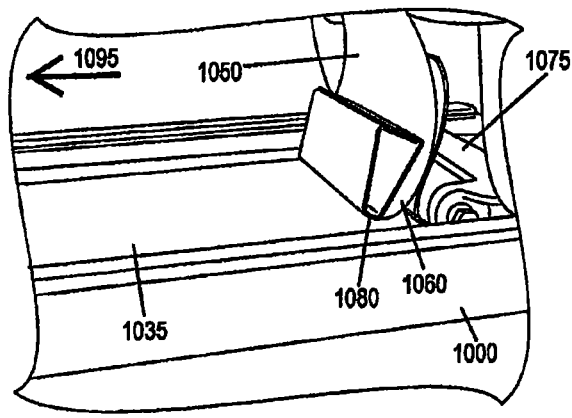
FIG. 10H illustrates a roller guiding apparatus with the mobile communication device mounted and with a roller apparatus being maneuvered to apply the film on the mobile communication device with the assistance of a wedge according to one or more embodiments described herein.

As the user continues to move the roller apparatus 1075 in the direction of arrow 1095, the backing portion 1060 of the film 1050 begins to separate from the portion of the film to be applied to the mobile communication device 1035 and at this position, the wedge 1080 is no longer in contact with the surface of the mobile communication device 1035. Instead, the wedge 1080 is separated from the top of the mobile communication device by the backing of the film 1050 as shown in FIG. 10H.

Figure 10I:
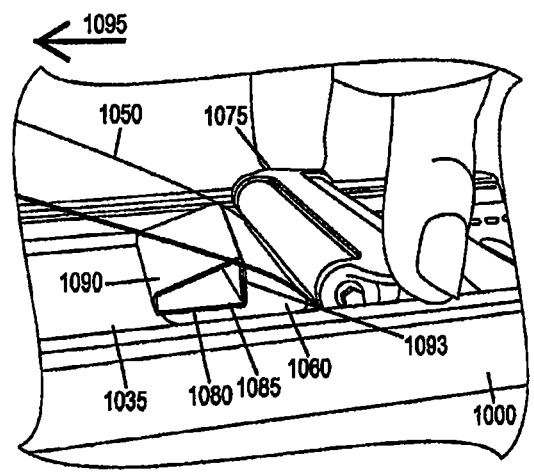
FIG. 10I illustrates a roller guiding apparatus with the mobile communication device mounted and with a roller apparatus moving the wedge during the application of a film to the mobile communication device according to one or more embodiments described herein.

FIG. 10I illustrates how the wedge 1080 works with the roller apparatus 1075 to separate the backing portion 1060 of the film 1050 and applies the exposed protective portion of the film 1050 onto the mobile communication device 1035. As the user continues to move the roller apparatus 1075 in the direction of arrow 1095, the pressure exerted by the roller apparatus 1075 causes the wedge 1080 to "flip over" such that the backing portion 1060, which still adheres on one side to the surface 1085 of the wedge 1080, is pulled away from the protective portion of the film 1050. In addition, the portion of the film 1050 that remains to be separated is kept out of the way by resting on the edge between the surfaces 1090 and 1093 of the wedge.

Figure 10J:
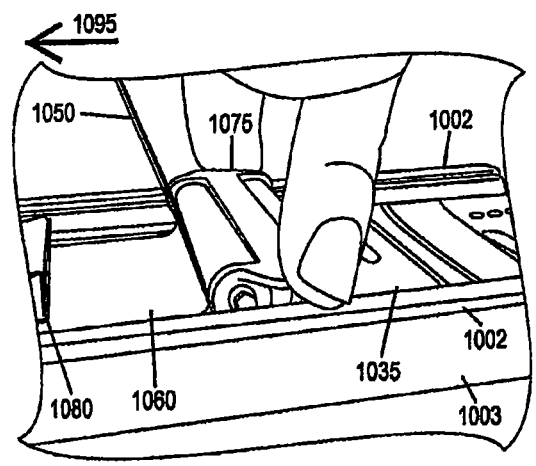
FIG. 10J illustrates a roller guiding apparatus with the mobile communication device mounted and with a roller apparatus positioned to apply a film on the mobile communication device with wedge located at the bottom portion of the mobile communication device according to one or more embodiments described herein.

As the user manipulates the roller apparatus 1075 from the position shown in FIG. 10I from the end proximal to the initial position and down through the rails 1002 of the roller apparatus guide 1000 to complete the film application process, the roller apparatus 1077 continues to apply force that moves the wedge 1080 away from its initial position as shown in FIG. 10J. Eventually, the wedge 1080 and the attached backing portion 1060 of the film 1050 may be completely separated from the protective portion of the film 1050 applied to the mobile communication device 1035, thereby completing the film application process.

In the manner described, the wedge 1080 may be utilized to assist the user to apply a film 1050 to a mobile communication device 1035 in conjunction with the roller apparatus 1075 and the roller guiding apparatus 1000.

Figure 11:
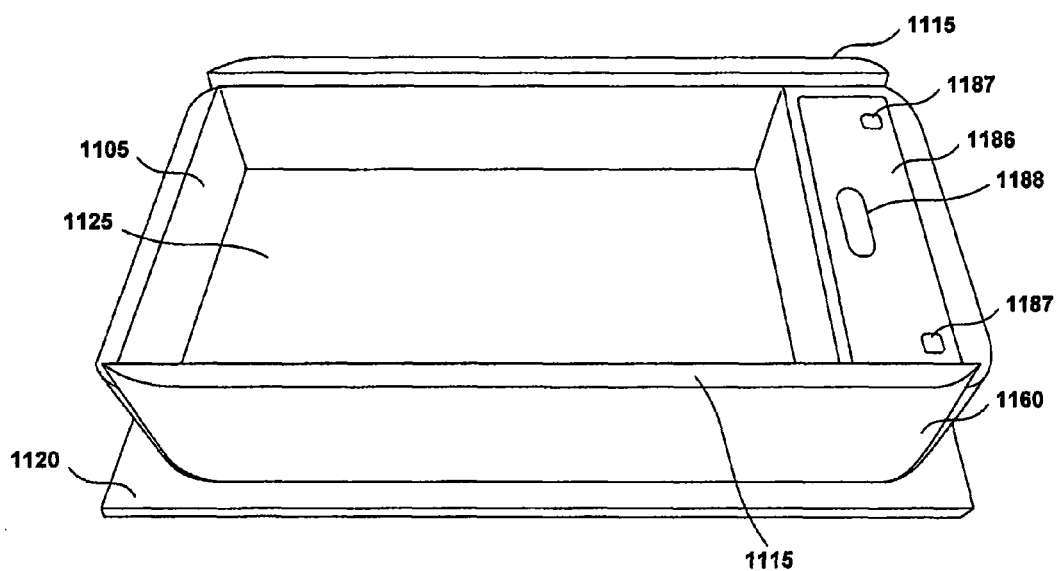
FIG. 11 illustrates a roller guiding apparatus according to one or more embodiments described herein.

FIG. 11 illustrates another embodiment of a roller guiding apparatus 1100. In this embodiment, the roller guiding apparatus 1100 may include a well for receiving any of a plurality of inserts (e.g., FIG. 12A or 12B, described below). Each insert may be customized for a particular mobile communication device suitable for applying a protective film to that particular mobile communication device. Advantageously, by configuring the roller guiding apparatus 1100 to receive any of a number of inserts, the protective film application process may be customized to any number of mobile communication devices with differing dimensions, curves, etc. while requiring only one "universal" roller guiding apparatus 1100. In other words, the user may swap in and swap out different inserts depending on the particular model of a mobile communication device.

Figure 12A:
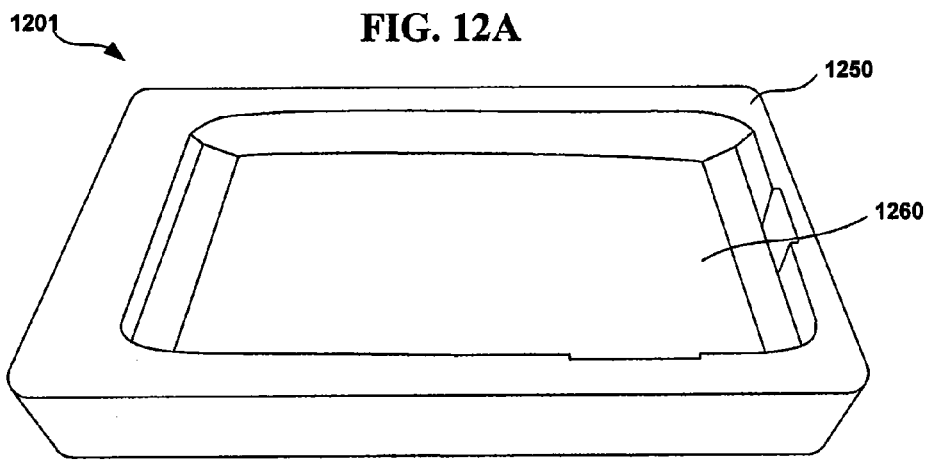
FIG. 12A illustrates an insert for a mobile communication device configured to be removably insertable into the roller guiding apparatus of FIG. 11 according to one or more embodiments described herein.
Figure 12B:
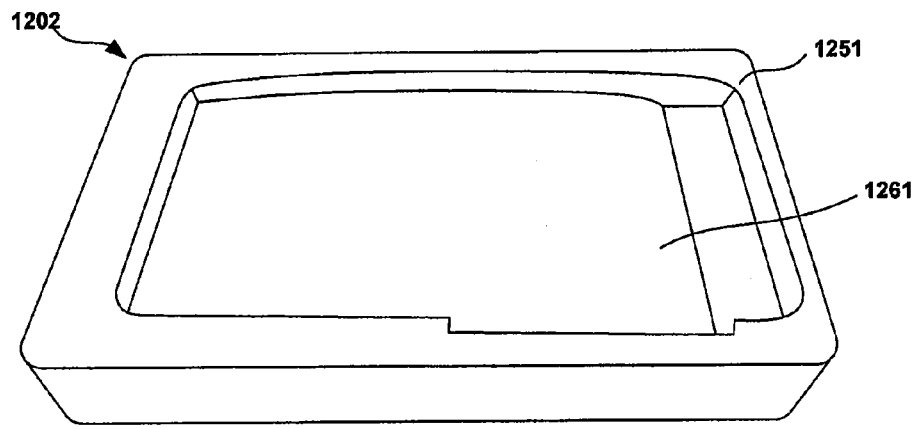
FIG. 12B illustrates an insert for a mobile communication device configured to be removably insertable into the roller guiding apparatus of FIG. 11 according to one or more embodiments described herein.

The roller guiding apparatus 1100 may have a body 1160 which include interior side surfaces 1105 and an interior bottom surface 1125, which in turn, define a well for receiving an insert apparatus (e.g., insert 1201 of FIG. 12A or insert 1202 of FIG. 12B). The roller guiding apparatus 1100 may also include a pair of rails 1115 which may function similarly to the rails 915 of FIG. 9A. The roller guiding apparatus 1100 may further include a tab receiving portion 1185 which may be an indented area sized to fit and hold a tab of a protective film. In one or more embodiments, the tab receiving portion 1185 may include one or more side engagement members 1187 which may protrude and engage a corresponding hole in a tab. The receiving portion 1187 may also include a middle engagement member 1188 which may protrude and engage a corresponding middle hole in a tab. As shown, the roller guiding apparatus 1100 may include a base 1120 integrated at the bottom portion of the body 1160. The base 1120 may allow a user to press down on the different portions during a film application process to stabilize the roller guiding apparatus 1100.

FIG. 12A illustrates one example of an insert 1201 having a ring 1250 defining a cavity 1260 for receiving a mobile communication device. FIG. 12B illustrates another example of another insert 1202 having a ring 1251 defining a cavity 1261 for receiving a different mobile communication device. As shown, the inserts 1201 and 1202 may have a similar or identical footprint. That is, the exterior surface of the ring 1250 and 1251 may be of the same shape and size, and configured to fit within a well of a roller guiding apparatus (e.g., roller guiding apparatus 1100). However, the interior surface of the ring 1250 and 1251 may be sized and shaped differently to fit and hold respective different models of mobile communication devices. In this manner, the user may desiring to apply a protective film to a Mobile Communication Device A fitting the interior cavity 1260 of the ring 1250 of FIG. 12A may swap in the insert 1201. And, if the user then desires to apply a protective file to a Mobile Communication Device B fitting the interior cavity 1261 of the ring 1251 of FIG. 12B may remove the insert 1201 and replace it with the insert 1202. Thus, by correlating (and designing) each insert to fit one model of a mobile communication device, a proper fitting and film application may be performed for any of a plurality of mobile communication devices by using only one "universal" roller guiding apparatus when the proper insert is used.

While the respective cavities shown by FIGS. 12A and 12B extend throughout top and bottom surfaces of inserts 1201 and 1202, in other embodiments, the bottom surface of the inserts may be closed.

Figure 13:
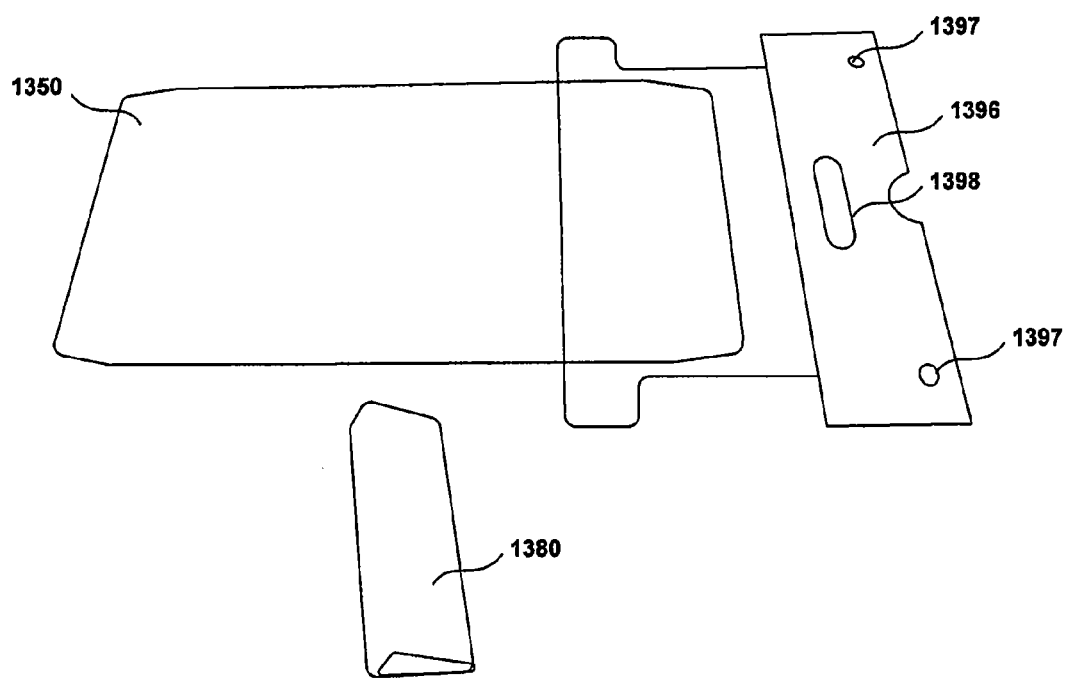
FIG. 13 illustrates a protective film removably attached to a tab and an accompanying wedge according to one or more embodiments described herein.

FIG. 13 illustrates a film 1350 (which may be the film 950 of FIG. 9D) attached to a tab 1396 (which may be a version of tab 996 of FIG. 9D). The tab 1396 may be insertable and held in place by a roller guiding apparatus (e.g., roller guiding apparatus 1100) and may further include a pair of cylinders 1397 for engaging side engagement members of the roller guiding apparatus. The tab 1396 may also include a larger hole between placement of the holes 1397 for engaging a middle engagement member of the roller guiding apparatus. In this manner, the tab 1396 may be held in place during a film application process. As shown here, a wedge 1380 may also be used during the film application process (e.g., similar to the functionality of the wedge 1080 of FIG. 10B).

In one or more embodiments, the film 1350 having the tab 1396 may further be compatible with another roller guiding apparatus 1400. In other words, the film 1350 may be compatible with roller guiding apparatus 1100 and/or the roller guiding apparatus 1400. The roller guiding apparatus 1400 may differ from roller guiding apparatus 1100 in that it is configured specifically for a particular model (i.e., size and shape) of a mobile communication device without requiring an insert. In one embodiment, the roller guiding apparatus 1400 is constructed out of plastic. However, other materials may be used such a metal.

As shown, the roller guiding apparatus 1400 may include a body 1460 having interior side surfaces 1405 and an interior bottom surface 1425, which in turn, define a cavity or well 1461 sized and shaped for receiving a particular model of a mobile communication device. In this manner, the user may place the mobile communication device snugly fitting the cavity or well 1461 for the purposes of applying the film (e.g., film 1360) to the mobile communication device. The depth of the cavity 1461 is about the thickness of the mobile communication device.

The roller guiding apparatus 1400 may also include a pair of rails 1415 which may function similarly to the rails 915 of FIG. 9A. The roller guiding apparatus 1400 may include a roller guiding surface 1499, which may include a top portion 1497 and side portions 1498. The top portion 1497 may be a region for supporting the roller apparatus initially during the film application process. The side portions 1498 may sandwich (e.g., be located on either side of) the cavity 1461 and each of the two side portions 1498 may be adjacent to a corresponding rail 1415. The side portions 1498 of the roller guiding surface 1499 function to support the roller during a film application process by providing a support surface on the outside of the cavity 1461 and inside the rails 1415. The top portion 1497 and the side portions 1498 lie along the same plane. The interior bottom surface 1425 lies along a plane that is substantially parallel to the plane of the top portion 1497 and the side portions 1498.

The roller guiding apparatus 1400 may further include a tab receiving portion 1485 which may be an indented area sized to fit and hold a tab of a protective film. In one or more embodiments, the tab receiving portion 1485 may include one or more side engagement members 1487 which may protrude and engage a corresponding hole in a tab. The tab receiving portion 1485 may also include a middle engagement member 1488 which may protrude and engage a corresponding middle hole in a tab. Alternatively, the tab receiving portion 1485 may simply be a designated portion for attaching to a tab (which is attached, at least in part, to the protective film). In other words, the tab may be attached in part to the tab receiving portion 1485 and attached in part to the protective film. The tab receiving portion 1485 may function along with the tab to align the protective film for easier and more accurate alignment and application of the protective film to the screen of the electronic device. The protective film is generally a clear thin plastic material for protecting the screen of the electronic device.

Figure 14:
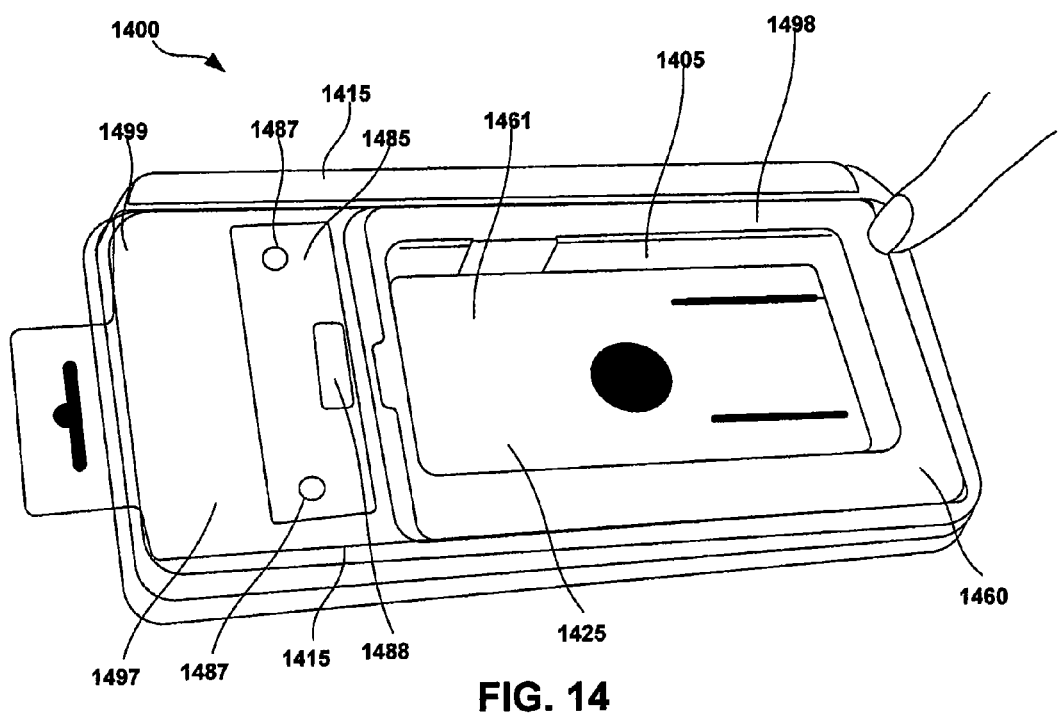
FIG. 14 illustrates a roller guiding apparatus according to one or more embodiments described herein.

While not shown in FIG. 14, in one or more embodiments, the roller guiding apparatus 1400 may include a base integrated at the bottom portion of the body 1460. The base may allow a user to press down on the different portions during a film application process to stabilize the roller guiding apparatus 1400.

The physical structure of certain components now having been described, attention will now be turned to how these certain components interact with each other to produce the desired effect of advantageously simplifying and making more efficient the process of applying a protective film on a mobile communication device.

Figure 15:
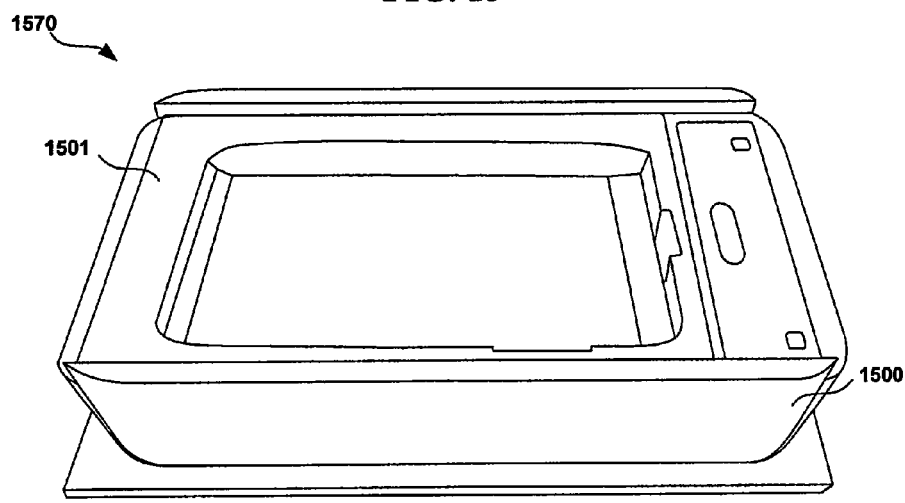
FIG. 15 illustrates an insert apparatus inserted into a roller guiding apparatus according to one or more embodiments described herein.

FIG. 15 illustrates a roller guiding apparatus-insert apparatus system 1570 shown with an insert 1501 (which, for example, may be insert 1201 of FIG. 12) inserted into a roller guiding apparatus 1500 (which for example, may be roller guiding apparatus 1100 of FIG. 11).

Figure 16:
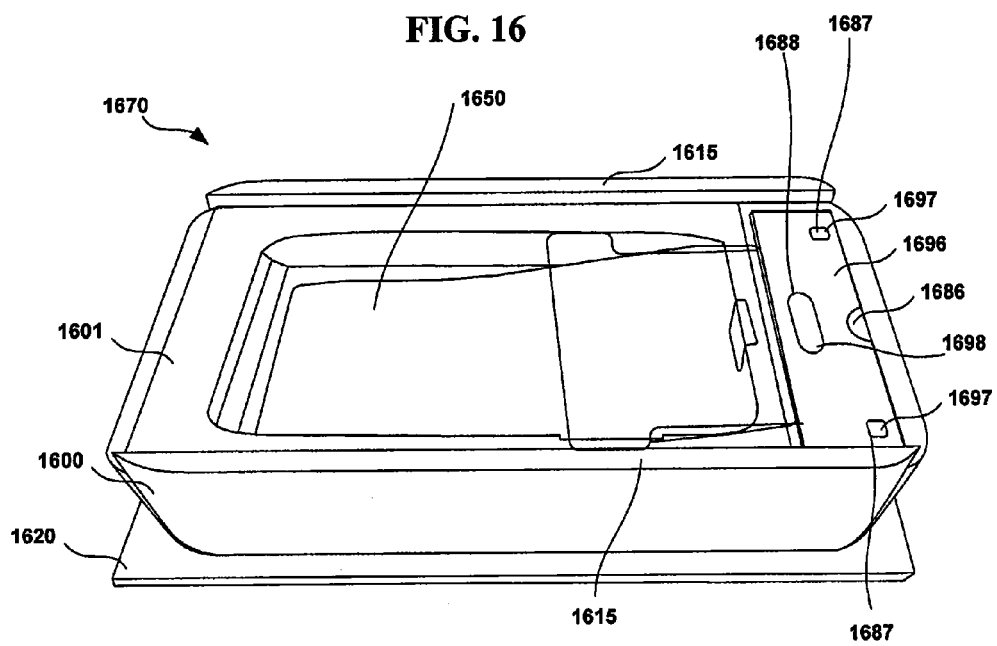
FIG. 16 illustrates an insert apparatus for a mobile communication device inserted into a roller guiding apparatus further shown with a protective film having a tab held in place within a tab receiving portion of the roller guiding apparatus according to one or more embodiments described herein.

FIG. 16 illustrates a roller guiding apparatus-insert apparatus system 1670 with the protective film and tab in place, awaiting the insertion of the mobile communication device to be protected by the film. More particularly, an insert 1601 (which, for example, may be insert 1201 of FIG. 12) inserted into a roller guiding apparatus 1600 (which for example, may be roller guiding apparatus 1100 of FIG. 11), and a protective film 1650 having a tab portion 1696 is placed in position. In practice, mobile communication device designed to snugly fit within the insert 1601 may be inserted into the cavity of the insert prior to the placement of the protective film 1650 and the tab portion 1696 being placed in position.

However, the mobile communication device in this instance has been removed for clarity.

As is shown in FIG. 16, the roller guiding apparatus 1600 may include rails 1615 for guiding a roller used in the film application process. The roller guiding apparatus 1600 may also include a base 1620 for allowing a user to better grip and manipulate the roller guiding apparatus 1600 during a film application process.

The interaction between the tab receiving portion 1686 and the tab portion 1696 is also illustrated in FIG. 16. Here, the tab 1696 may held in position by the tab receiving portion by substantially lining up the tab 1696 into the indent at the tab portion 1696. Alternatively or in addition, a pair of side engagement members 1687 of the tab receiving portion 1686 and a middle engagement member 1688 may penetrate corresponding holes 1697 and 1698 for holding the tab portion 1696 in place and for accurately aligning the tab portion 1696 so that the protective film 1650 can be properly and accurately applied onto the mobile communication device.

Once the mobile communication device is inserted in place, operation to apply the protective film 1650 may be similar to operations described herein (e.g., as shown in FIGS. 9B-9F).

Figure 17:
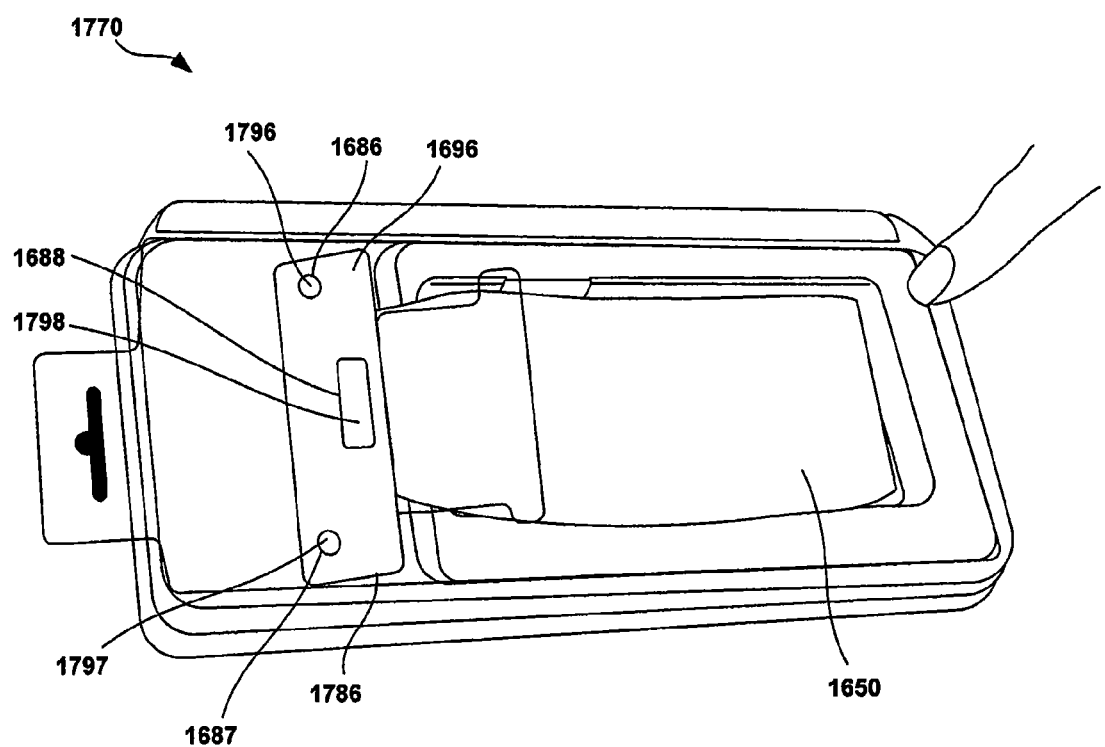
FIG. 17 illustrates roller guiding apparatus further shown with a protective film having a tab held in place within a tab receiving portion of the roller guiding apparatus according to one or more embodiments described herein.

FIG. 17 illustrates a roller guiding apparatus system 1770 with the protective film and tab in place, awaiting the insertion of the mobile communication device to be protected by the film. That is, instead of operating with roller guiding apparatus 1670, the film 1650 may be used in connection with the roller guiding apparatus system 1770.

The protective film 1650 having a tab portion 1696 is placed in position as shown in FIG. 17. In practice, mobile communication device designed to fit within the roller guiding apparatus system 1770 may be inserted into the cavity of the prior to the placement of the protective film 1650 and the tab portion 1696 being placed in position. However, the mobile communication device in this instance has been removed for clarity.

As is shown in FIG. 17, the roller guiding apparatus system 1770 may be constructed out of a flexible, semi-rigid or rigid plastic material for use in the film application process. The interaction between the tab receiving portion 1786 and the tab portion 1696 is also illustrated in FIG. 17. Here, the tab 1696 may be held in position by the tab receiving portion 1786 by substantially lining up the tab 1696 into the indent at the tab receiving portion 1786. Alternatively or in addition, a pair of side engagement members 1796 and 1797 of the tab receiving portion 1786 may penetrate corresponding holes 1686 and 1687, and a middle engagement member 1798 may penetrate corresponding middle hole 1688 for holding the tab portion 1696 in place and for accurately aligning the tab portion 1696 so that the protective film 1650 can be properly and accurately applied onto the mobile communication device.

Once the mobile communication device is inserted in place, operation to apply the protective film 1650 may be similar to operations described herein (e.g., as shown in FIGS. 9B-9F).

Figure 18A:
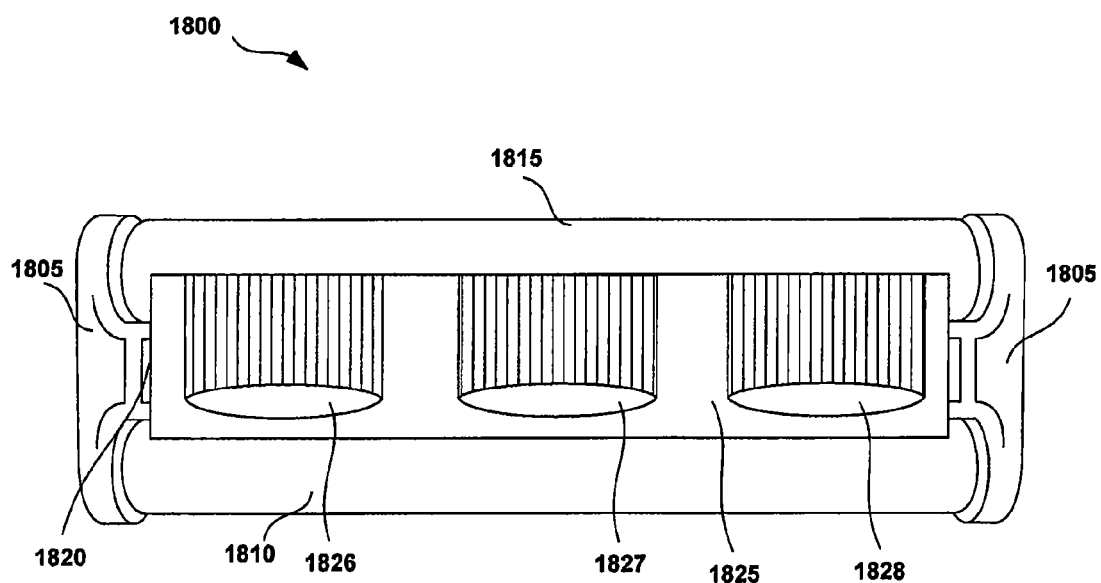
FIG. 18A illustrates roller apparatus having a finger supporting platform according to one or more embodiments described herein.

FIG. 18A illustrates one embodiment of a roller apparatus 1800. The roller apparatus 1800 may be, for example, a variant of roller apparatus 200, 300, 400 and may be structured to accomplish substantially the same functions. One difference between the roller apparatus 1800 and other roller apparatuses whether disclosed herein or not, is that the roller apparatus 1800 may include the finger supporting platform 1825 having the plurality of indentations 1826, 1827 and 1828. The finger supporting platform 1825 is substantially flat except for the areas of the plurality of indentations 1826, 1827 and 1828.

As shown, the roller apparatus 1800 may further include a roller base or carriage 1805, a first or front roller 1810, a second or back roller 1815 and a mid-bar 1820.

The roller base 1805 may be constructed out of a rigid material such as a plastic, a metal, a wood and the like. The roller base 1805 is configured to provide structural support for the roller apparatus 1800. In addition, the roller base 1805 may be sized to be easily manipulated and by the user placing one of his or her fingers in each of the plurality of indentations 1826, 1827 and 1828.

The roller base 1805 may be configured to hold the first roller 1810 in place and allow the first roller 1810 to "roll" or rotate about a longitudinal axis created by the roller base 1805. In one example, the roller base 1805 may be structured to include a first rod member (not shown) spanning the entire length of the first roller 1810, thereby forming an axis or axle for the first roller 1810 to rotate about. The first roller 1810 is configured to rotate and apply physical pressure on a film (e.g., film 150 of FIG. 1) in operation. The second roller 1815 may be an additional pressure applicator and may be substantially the same size as, and substantially parallel to the first roller 1810. The roller apparatus 1800 may include a second rod member (not shown) spanning the entire length of the second roller 1815, thereby forming an axis or axle for the second roller 1815 to rotate about. The first roller 1810 and the second roller 1815 may be separated by a mid bar 1820.

The mid bar 1820 may connect the two ends of the roller base 1805 and provide the entire roller apparatus 1800 with stability.

Figure 18B:
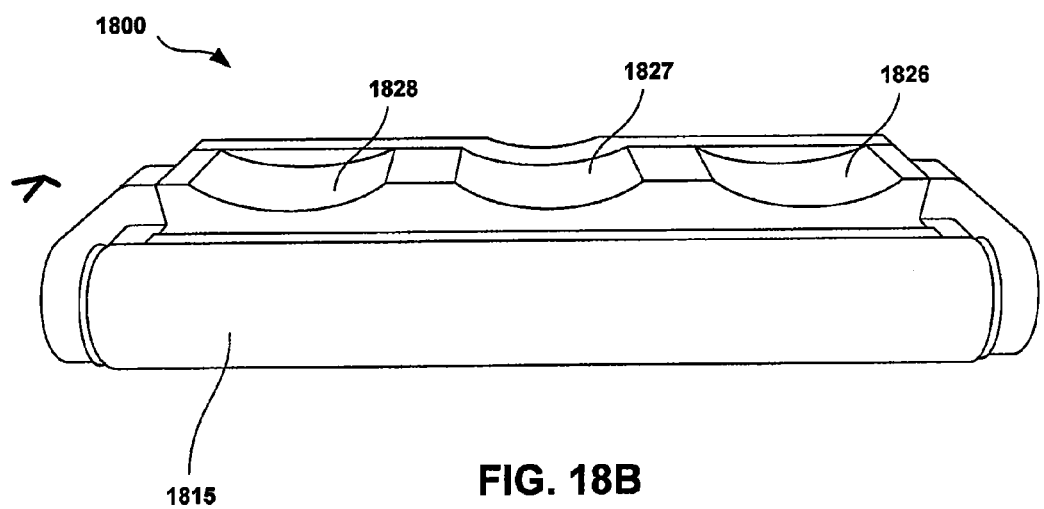
FIG. 18B illustrates a perspective view of the roller apparatus of FIG. 18A according to one or more embodiments described herein.

FIG. 18B is a perspective view of the roller apparatus 1800. In one embodiment, the roller apparatus 1800 may be configured to function as a film applicator for phone-sized devices and may have a length of 1-2 inches, a width of 2-4 inches, and a height of 0.5-1 inch. In one embodiment, the roller apparatus 1800 may be configured to function as a film applicator for tablet-sized devices and may have a length of 1-5 inches, a width of 8-12 inches, and a height of 0.5-2 inches. Other dimensions are also possible depending on the size of the device to be protected and/or depending on the size of the film to be applied. As shown, each of the plurality of indentations 1826, 1827 and 1828 has a curved concave surface for easy manipulation by the user's fingers and for allowing stronger pressure to be applied for proper application (i.e., little to no air bubbles between the protective film and the electronic communication device) of the protective film.

Figure 19A:
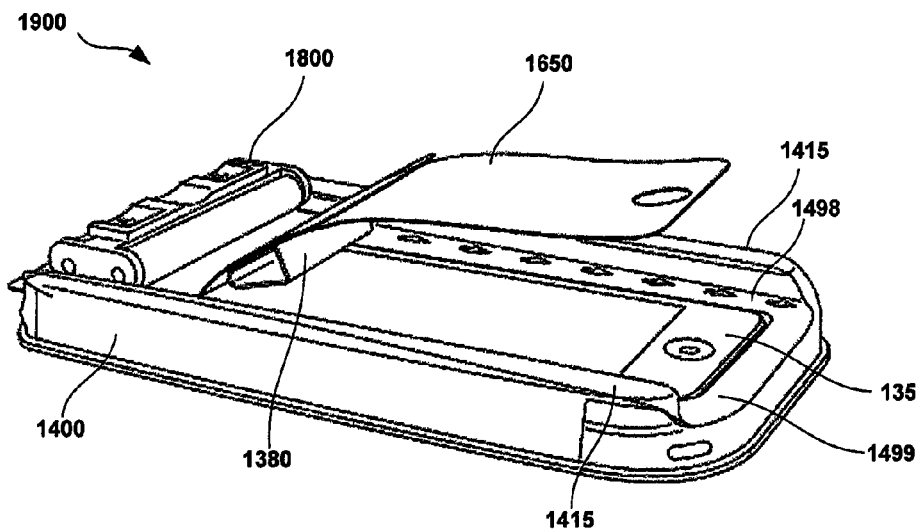
FIG. 19A illustrates a perspective view of the roller apparatus of FIG. 18A positioned on a roller guiding apparatus according to one or more embodiments described herein.

FIG. 19A is a perspective view of a system 1900, which may include the roller apparatus 1800 of FIG. 18A, the roller guide apparatus 1400 of FIG. 14, the wedge 1380 (e.g., a triangular shaped wedge) of FIG. 13B, and the protective film 1650 of FIG. 16. The roller guide apparatus 1400 is substantially rectangular in shape (e.g., with rounded edges) and the cavity 1461 is substantially rectangular in shape (e.g., with rounded edges) or shaped to allow the electronic device 135 to fit snugly therein. As shown, the electronic device 135 of FIG. 1 in inserted into the cavity 1461 of the roller guide apparatus 1400 such that the top surface or screen of the electronic device 135 is flush with (i.e., lies along the same or substantially the same plane) or is slightly above the side portions or surfaces 1498 of the roller supporting surface 1499 of the roller guide apparatus 1400. As shown, the roller apparatus 1800 is positioned between the rails 1415 at the top portion 1497 of the roller guide apparatus 1400. The rails 1415 protrude or extend above the roller supporting surface 1499. The rails 1415 are used to contain or guide the roller apparatus 1800 therebetween for moving the roller apparatus 1800 along or on the roller supporting surface 1499.

The wedge 1380 is attached to a backing of the protective film 1650. The wedge 1380 is used to help pull the backing off the protective film 1650 when the roller apparatus 1400 is pushed against the tab 1696 and/or the protective film 1650. Once the backing of the protective film 1650 is partially or fully separated from the adhesive portion, the roller apparatus 1400 may be moved in the direction of the arrows to perform both the application of the protective film 1650 and the removal of the backing of the protective film 1650. Furthermore, the rails 1415 are substantially parallel and serve to align and guide the movement of the roller apparatus 1400, thus the system 1900 may be considered to be self-aligning and air bubble-free.

Figure 19B:
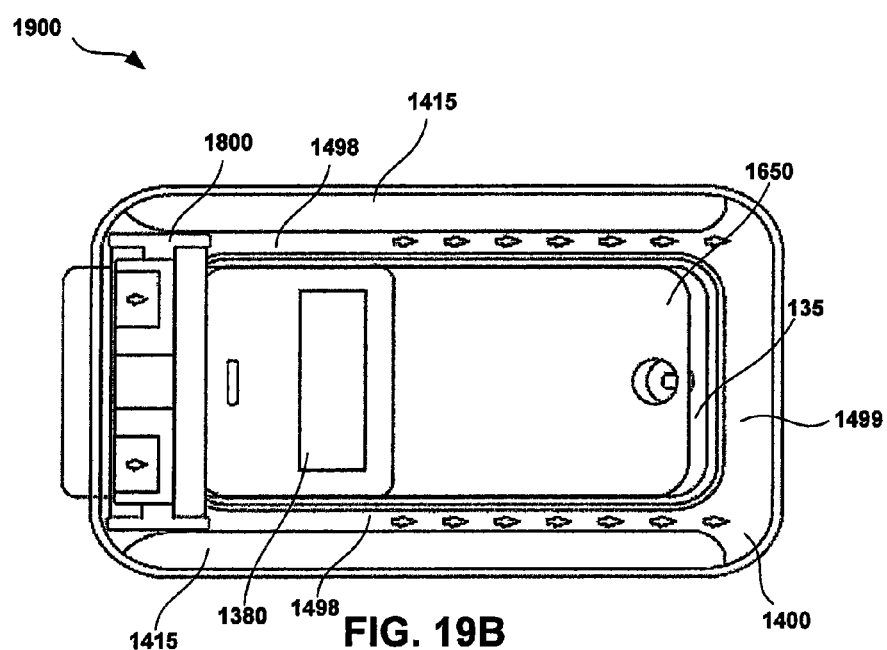
FIG. 19B illustrates a top view of the system of FIG. 19A according to one or more embodiments described herein.

FIG. 19B is a top view of the system 1900 of FIG. 19A and more clearly illustrates the top portion of the roller supporting surface 1499 on which the roller apparatus 1800 is shown positioned. The side portions 1498 of the roller supporting surface 1499 are shown on both sides of the electronic device 135 and function as portions of the roller guide apparatus 1400 which support the roller apparatus 1800 during the film application process.

In one or more embodiments, the rails 1415 of the roller guide apparatus 1400 may be removed or eliminated to allow the user variations in control of the movement of the roller apparatus 1800.

Figure 20A:
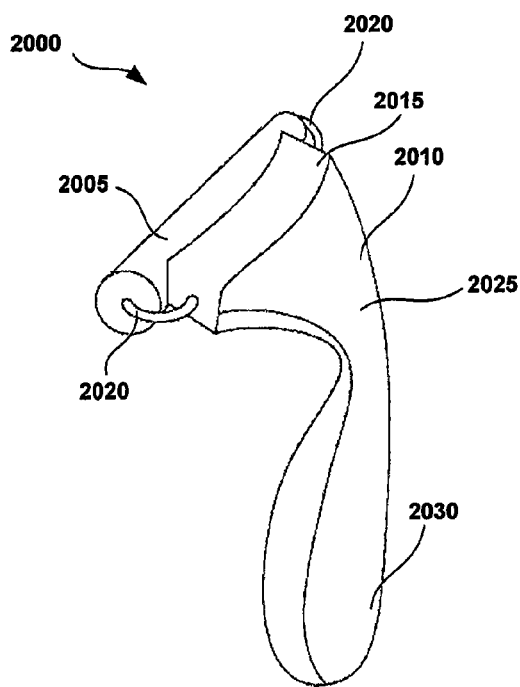
FIG. 20A illustrates a perspective view of a roller apparatus according to one or more embodiments described herein.
Figure 20B:
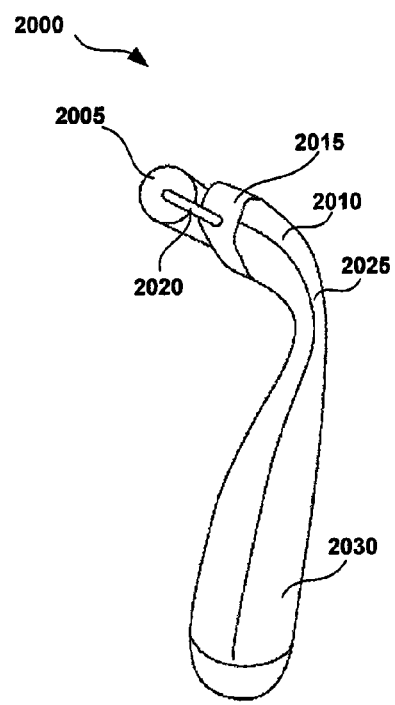
FIG. 20B illustrates a side view of the roller apparatus of FIG. 20A according to one or more embodiments described herein.
Figure 20C:
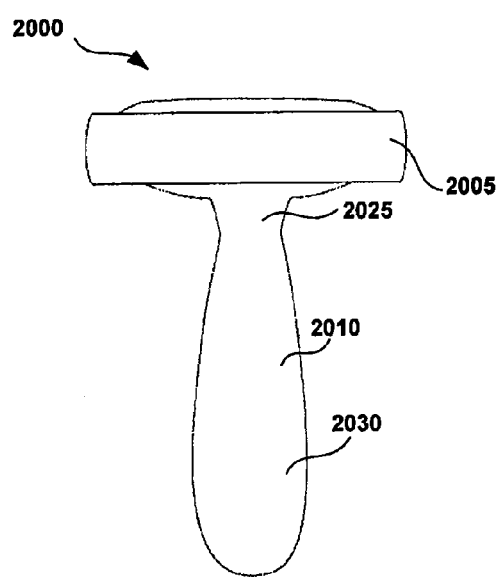
FIG. 20C illustrates a front view of the roller apparatus of FIG. 20A according to one or more embodiments described herein.

FIG. 20A illustrates another embodiment of a roller apparatus 2000 which may be used to apply a protective film to a surface of a mobile communication device. Here, the roller apparatus 2000 may include a roller 2005 attached to a body 2010. The body 2010 may include a head 2015, a curved neck 2025 and a shaft 2030 configured to be gripped by a user's hand for operation of the roller apparatus 2000. The head 2015 may be attached to the roller 2005 via connectors 2020 which enable the roller 2005 to spin about an axis in a manner similar to the other rollers described herein to apply a pressure to a protective film (e.g., film 1650) during a film application process. FIGS. 20B and 20C illustrate a side view and a front view of the roller apparatus 2000. The roller 2000 may be used as a stand alone device or as part of a system including a roller supporting apparatus (e.g., in place of roller 1800 as part of the system 1900).

Skilled artisans may implement the described functionality in varying ways for each particular application, but such implementation decisions should not be interpreted as causing a departure from the scope of the disclosed apparatus and/or methods.

The previous description of examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The elements and uses of the above-described embodiments can be rearranged and combined in manners other than specifically described above, with any and all permutations within the scope of invention. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope. In addition, the invention is not limited to the illustrated embodiments, and all embodiments of the invention need not necessarily achieve all the advantages or purposes or possess all characteristics identified herein.

What is claimed is:

1. A roller apparatus configured to be held in a user's hand for applying a protective layer to a surface of an electronic device, the roller apparatus comprising:
    a first roller having a first end and a second end and being configured to press the protective layer against the surface of the electronic device;
    a second roller having a first end and a second end and being positioned substantially parallel to the first roller and configured to press the protective layer against the surface of the electronic device;
    a bar having a first end and a second end and being positioned between the first roller and the second roller;
    a first side panel attached to the first end of the bar and coupled to the first end of the first roller and the first end of the second roller;
    a second side panel attached to the second end of the bar and coupled to the second end of the first roller and the second end of the second roller; and
    a support platform attached to the bar and positioned above the bar, the support platform including a plurality of indentations for the user's fingers to be placed in and to press against to allow movement of the first roller and the second roller to press the protective layer against the surface of the electronic device, each of the plurality of indentations being positioned above the bar and indented in a direction that is downward towards the bar, the plurality of indentations being configured to allow the user to direct the movement of the first roller and the second roller, and the support platform being substantially flat except for the plurality of indentations.

2. The roller apparatus of claim 1, wherein the support platform includes three indentations arranged in a row.

3. An apparatus for applying a screen protector to a mobile communications device, the apparatus comprising:
- a body defining a cavity having a width and a length and being configured to receive the mobile communications device, the body having:
  - interior side surfaces for defining a perimeter of the cavity,
  - an interior bottom surface coupled to the interior side surfaces for defining a bottom of the cavity, and
  - a top surface and side surfaces located exterior to and adjacent to the cavity;
- a screen protector having a first end and a second end and a length therebetween, with the second end extending away from the first end such that the length of the screen protector extends along the length of the cavity, the screen protector having a backing portion and an adhesive portion, with the adhesive portion being sized to fit within the cavity, and the adhesive portion configured to be adhered to a screen of the mobile communications device when the backing portion is separated from the adhesive portion; and
- a tab having a first end and a second end, the first end of the tab coupled to the top surface of the body and the second end of the to tab coupled to the first end of the screen protector to thereby couple the first end of the screen protector to the top surface the body, the adhesive portion being sandwiched between the second end of the tab and the backing portion, and
- the tab being configured such that the first end of the tab and the adhesive portion each remain attached to the top surface of the body while the backing portion is being separated from the adhesive portion.

4. The apparatus of claim 3, wherein the top surface of the body includes an indented area for receiving the first end of the tab.

5. The apparatus of claim 3, wherein the tab couples to the top surface of the body to align the screen protector over the screen of the mobile communications device when the mobile communications device is positioned in the cavity.

6. The apparatus of claim 3, wherein the adhesive portion is configured to protect the screen of the mobile communications device.

7. The apparatus of claim 3, wherein the screen protector is sized such that the second end of the screen protector may move in and out of the cavity when the mobile communications device is not positioned in the cavity.

8. The apparatus of claim 3, wherein the tab is coupled to the screen protector such that the tab separates from the backing portion when the hacking portion is separated from the adhesive portion.

9. The apparatus of claim 3, wherein the screen protector is configured such that the backing portion is positioned between the adhesive portion and the mobile communications device when the mobile communications device is positioned in the cavity and the screen protector extends over the mobile communications device.

10. The apparatus of claim 3, wherein the cavity has a rectangular shape.

* * * * *